(12) United States Patent
Imai et al.

(10) Patent No.: US 8,655,350 B2
(45) Date of Patent: Feb. 18, 2014

(54) SEMICONDUCTOR STORAGE DEVICE AND STORAGE SYSTEM

(75) Inventors: Shigeki Imai, Osaka (JP); Yukihiro Nakamura, Kyoto (JP); Hiroyuki Ochi, Kyoto (JP); Naohisa Ohta, Yokohama (JP); Sadayasu Ono, Tokyo (JP)

(73) Assignees: Sharp Kabushiki Kaisha, Osaka (JP); Kyoto University, Kyoto (JP); Keio University, Tokyo (JP)

( * ) Notice: Subject to any disclaimer, the term of this patent is extended or adjusted under 35 U.S.C. 154(b) by 993 days.

(21) Appl. No.: 12/681,296

(22) PCT Filed: Sep. 26, 2008

(86) PCT No.: PCT/JP2008/067490
§ 371 (c)(1),
(2), (4) Date: Apr. 1, 2010

(87) PCT Pub. No.: WO2009/044677
PCT Pub. Date: Apr. 9, 2009

(65) Prior Publication Data
US 2010/0214817 A1     Aug. 26, 2010

(30) Foreign Application Priority Data

Oct. 2, 2007   (JP) .................................. 2007-258836
Jul. 14, 2008   (JP) .................................. 2008-182931

(51) Int. Cl.
*H04W 24/00* (2009.01)

(52) U.S. Cl.
USPC ......... 455/425; 455/423; 455/41.1; 455/41.2; 455/67.11; 455/67.12; 455/67.13; 455/572; 455/573; 455/343.1; 340/572.1; 340/10.1; 340/10.34; 340/13.24; 340/13.25; 340/13.26; 324/750.16; 324/750.22; 324/750.23; 324/750.24; 324/762.01

(58) Field of Classification Search
USPC ......... 455/423–425, 41.1–41.2, 67.11, 67.12, 455/67.13, 572, 573, 343.1; 340/572.1, 340/539.1, 539.13, 10.1, 10.34, 13.24, 340/13.25, 13.26; 324/750.16, 750.22, 324/750.23, 750.24, 762.01
See application file for complete search history.

(56) References Cited

U.S. PATENT DOCUMENTS 5,253,184 A * 10/1993 Kleinschnitz ................. 702/184
6,097,292 A *  8/2000 Kelly et al. ................. 340/572.7
(Continued)

FOREIGN PATENT DOCUMENTS

EP     1 033 675 A2    9/2000
EP     1 422 658 A2    5/2004
(Continued)

OTHER PUBLICATIONS

Chinese Office Action mailed Feb. 22, 2012 with partial English translation.

(Continued)

*Primary Examiner* — Tuan A Tran
(74) *Attorney, Agent, or Firm* — Birch, Stewart, Kolasch & Birch, LLP.

(57) ABSTRACT

A pn junction type solar cell is formed in a predetermined region on a substrate made of glass. Light emitted from a light emitting unit reaches an n-type semiconductor layer after it passed through substrate. The solar cell generates electromotive force corresponding to a quantity of the emitted light. A control circuit, a mask ROM, a transmitting circuit and an antenna are formed on an upper side of the solar cell. A surface of a semiconductor storage device is entirely covered with an insulating film to block entry of outside air. The insulating film is typically formed of physicochemically stable glass or silicon dioxide.

13 Claims, 20 Drawing Sheets

(56) References Cited

U.S. PATENT DOCUMENTS

| | | | |
|---|---|---|---|
| 6,104,291 A | 8/2000 | Beauvillier et al. | |
| 6,842,606 B1 | 1/2005 | Takemura | |
| 6,976,197 B2 * | 12/2005 | Faust et al. | 714/723 |
| 7,561,875 B1 * | 7/2009 | Eberle | 455/423 |
| 7,795,895 B2 * | 9/2010 | Hsieh et al. | 324/762.02 |
| 7,850,086 B2 * | 12/2010 | Nakane et al. | 235/492 |
| 8,160,636 B2 * | 4/2012 | Tadokoro | 455/550.1 |
| 2003/0217067 A1 * | 11/2003 | Gilstrap et al. | 707/100 |
| 2004/0129450 A1 | 7/2004 | Yamazaki et al. | |
| 2004/0253922 A1 * | 12/2004 | deBlanc et al. | 455/41.1 |
| 2006/0198219 A1 | 9/2006 | Okano et al. | |
| 2006/0246840 A1 | 11/2006 | Borowski et al. | |
| 2007/0158804 A1 | 7/2007 | Hosoya et al. | |
| 2008/0100329 A1 * | 5/2008 | Nguyen et al. | 324/765 |

FOREIGN PATENT DOCUMENTS

| | | |
|---|---|---|
| GB | 2 428 802 A | 2/2007 |
| JP | 8-43527 A | 2/1996 |
| JP | 10-063807 A | 3/1998 |
| JP | 2001-14432 A | 1/2001 |
| JP | 2001-209772 A | 8/2001 |
| JP | 2006-191496 A | 7/2006 |
| JP | 2006-237454 A | 9/2006 |
| JP | 2007-188498 A | 7/2007 |
| JP | 2007-214545 A | 8/2007 |
| WO | 03/025944 A1 | 3/2003 |

OTHER PUBLICATIONS

European Search Report mailed Mar. 2, 2012.

\* cited by examiner

READ DATA

FIG.26
(A)
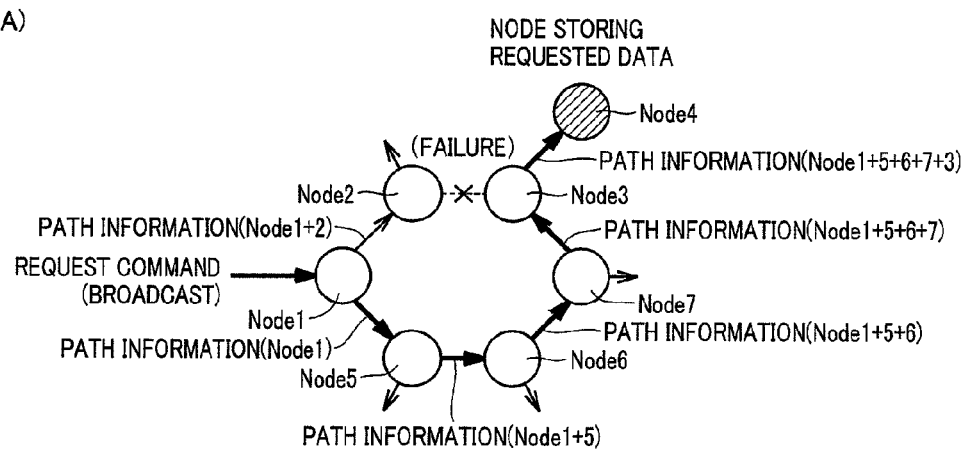
(B)
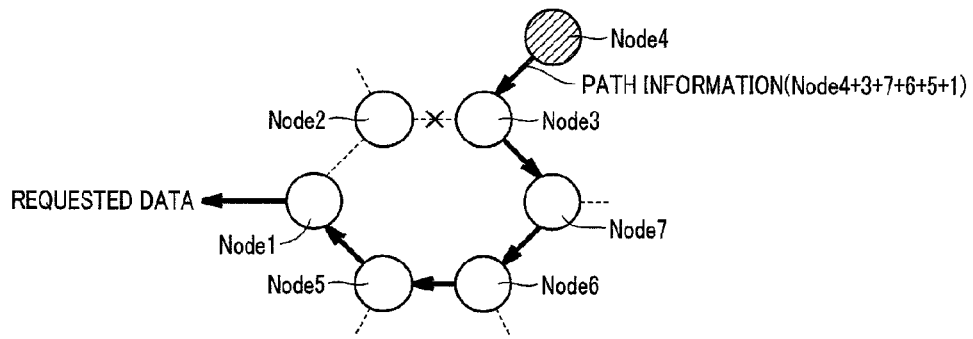

SEMICONDUCTOR STORAGE DEVICE AND STORAGE SYSTEM

TECHNICAL FIELD

The present invention relates to a semiconductor storage device using a semiconductor device as well as a storage system including it, and particularly to a technique that can reliably perform long-term data storage.

BACKGROUND ART

As information communication technologies have rapidly developed in recent years, services for providing multimedia contents containing a large amount of data are becoming widespread. As one of forms for providing such multimedia contents, there has been proposed a form of movie activities called "digital cinema" that uses digital information for shooting and screening, instead of a form which uses conventional films for the shooting and screening. Standardization organizations such as Digital Cinema Initiative, LLC (Limited Liability Company) have been established for such digital cinema.

According to the digital cinema, such a form is expected that edition is performed after digitizing the image in the image-taking process, and screening is performed by distributing it to movie theaters over a network. The use of such digital data can prevent deterioration of images that may occur due to age deterioration of films and mechanical damages caused by screening.

Ideally, it is has been desired to conserve permanently the movie contents that have great value as cultural properties. In the conventional film movies, the quality of the movie contents themselves has been kept by reprinting the films, e.g., every year.

Conversely, the digital information is stored by storing them on various recording mediums such as magnetic tape, magnetic disc, optical disc, magneto-optical disc or flash memory. However, these recording mediums have a limited life. For example, it has been that the optical discs such as CD (Compact Disc) and DVD (Digital Versatile Disc) have the life of several tens of years because a recording layer made of aluminum or the like corrodes due to intrusion of atmosphere. In the recording medium such as magnetic tape or magnetic disc (e.g., hard disc or flexible disc) of the type that records data using the magnetism, the magnetism itself naturally decays with time, and further is liable to be affected by external magnetic field so that it is practically difficult to keep the data storage for a long term. In the recording medium such as a flash memory of the type that uses electric charges for storing the data, the charges themselves naturally decay with time and are liable to be affected by external magnetic field so that it is practically difficult to keep the data storage for a long term.

As stated above, these recording mediums that are now widespread cannot practically hold the data for a long term, and require further reproduction or duplication at predetermined intervals, similarly to the conventional films.

Accordingly, semiconductor storage devices such as a mask ROM (Read Only Memory) have been expected as recording mediums having a longer life. Such semiconductor storage devices are made of silicon that is physically and chemically stable, and therefore are hardly affected by corrosion and the like. For example, Japanese Patent Laying-Open No. 2006-237454 (Patent Document 1) has disclosed a structure and a manufacturing method of the above mask ROM.

Patent Document 1: Japanese Patent Laying-Open No. 2006-237454

DISCLOSURE OF THE INVENTION

Problems to be Solved by the Invention

The semiconductor storage device described above has an electric circuit formed of silicon layers containing a small amount of impurities, a metal layer and others, and stores information (digital data) by bringing the information into correspondence with a quantity of a current flowing in this electric circuit and/or presence/absence of such a current. Thus, the reading of information from the semiconductor storage device means outputting of an electric signal corresponding to the stored information from the semiconductor storage device. Therefore, the semiconductor storage device is provided with an input/output unit made of metal and called a "pad unit" as an interface for reading the information.

However, an ordinary pad unit is exposed to an atmosphere so that circuits formed in the semiconductor storage device may be corroded through the pad unit. Further, even when the corrosion can be suppressed by filling resin into the pad unit, or by keeping and managing it in an inert gas or under a vacuum condition, problems of corrosion and abrasion may occur on a metal terminal that is in contact with the pad unit for reading out the information. Thus, the problems of corrosion and abrasion cannot be avoided as long as the contact type is used for implementing the information reading. For these reasons, it is difficult to store the information permanently in the semiconductor storage device.

The invention has been made for overcoming the above problems, and an object of the invention is to provide a semiconductor storage device that has a longer life than the conventional semiconductor storage device as well as a storage system including the semiconductor storage device.

Means for Solving the Problems

A semiconductor storage device according to an aspect of the invention includes a substrate; a nonvolatile storage unit arranged on the substrate for nonvolatilely storing data; an electric power generating unit arranged on the substrate for receiving energy externally supplied in a non-contact fashion and generating internal electric power; a transmitting unit arranged on the substrate for receiving the internal electric power and transmitting by radio the data stored in the nonvolatile storage unit; and a sealing film covering exposed surfaces of the nonvolatile storage unit, the electric power generating unit and the transmitting unit.

Preferably, the substrate is a glass substrate, and the electric power generating unit is a solar cell configured to receive light passed through the glass substrate.

Preferably, the semiconductor storage device further includes an antenna connected to the transmitting unit. The electric power generating unit extracts a part of radio signals received through the antenna as electric power.

Preferably, the semiconductor storage device includes a plurality of storage cells separated from each other. Each of the plurality of storage cells includes the nonvolatile storage unit, the electric power generating unit and the transmitting unit, and a frequency of the radio signal transmitted from the transmitting unit of each of the storage cells is different from those of the other cells.

Preferably, the sealing film is a silicon dioxide film.

A storage system according to another aspect of the invention includes a semiconductor storage device; and a data reading device. The semiconductor storage device includes a substrate, a plurality of storage cells arranged on the substrate, and a sealing film covering exposed surfaces of the plurality of storage cells. Each of the plurality of storage cells includes a nonvolatile storage unit for nonvolatilely storing data, an electric power generating unit for receiving energy externally supplied in a non-contact fashion and generating internal electric power, and a transmitting unit for receiving the internal electric power and transmitting by radio the data stored in the nonvolatile storage unit. The data reading device includes an energy supply unit for supplying energy to the semiconductor storage device, and a plurality of receiving units arranged corresponding to the plurality of storage cells of the semiconductor storage device, respectively.

A storage system according to still another aspect of the invention includes a plurality of semiconductor storage devices; and a data reading device. The plurality of semiconductor storage devices are arranged close according to a predetermined rule. Each of the plurality of semiconductor storage devices includes a light-transmitting substrate; an electric power generating unit for receiving the light passed through the substrate and generating electric power, a nonvolatile storage unit arranged on the substrate for nonvolatilely storing the data, a communication unit arranged on the substrate for receiving the electric power from the electric power generating unit and transmitting by radio the data stored in the nonvolatile storage unit to the semiconductor storage device neighboring to the device to which the communication unit belongs, and a sealing film covering exposed surfaces of the electric power generating unit, the nonvolatile storage unit and the communication unit. The data reading device includes a light emitting unit for emitting light to the plurality of semiconductor storage devices, and a reading unit arranged close to at least one of the plurality of closely arranged semiconductor storage devices for receiving the data transmitted by radio from the semiconductor storage device.

Preferably, the communication unit transfers the data received from any neighboring semiconductor storage device to any other semiconductor memory device of the semiconductor storage devices.

Preferably, the communication unit transfers the data received from the neighboring semiconductor storage device to a destination and thereafter transmits the data stored in the nonvolatile storage device to the destination.

Preferably, the substrate has a substantially circular disk-like form. The communication unit includes a receiving unit for receiving the data from a semiconductor storage devices neighboring to the device to which the communication unit belongs, and a transmitting unit for transmitting the data to another semiconductor storage devices neighboring to the device to which the communication unit belongs. The receiving unit and the transmitting unit are spaced from each other by a predetermined circumferential angle about a center of the substantially circular disk-like substrate. The plurality of semiconductor storage devices are arranged to have diametrical centers aligned on the same straight line, and the receiving unit of one of the neighboring two semiconductor storage devices is close to the transmitting unit of the other of the neighboring two semiconductor storage devices.

Preferably, each of the plurality of semiconductor storage devices is arranged such that it is close to the semiconductor storage devices. The communication unit includes a plurality of transmitting/receiving units configured to perform data transmission and data reception with respect to the semiconductor storage device neighboring to the device to which the communication unit belongs. Each of the transmitting/receiving units establishes an ad-hoc network with respect to the neighboring semiconductor storage device.

Preferably, the sealing film is a silicon dioxide film.

According to further another aspect, the invention provides a semiconductor storage device for use in a storage system including a plurality of semiconductor storage devices arranged close to each other according to a predetermined rule. The semiconductor memory device includes a light-transmitting substrate; an electric power generating unit for receiving the light passed through the substrate and generating electric power; a nonvolatile storage unit arranged on the substrate for nonvolatilely storing the data; a communication unit arranged on the substrate for receiving the electric power from the electric power generating unit and transmitting by radio the data stored in the nonvolatile storage unit to the semiconductor storage device neighboring to the device to which the communication unit belongs; and a sealing film covering exposed surfaces of the electric power generating unit, the nonvolatile storage unit and the communication unit.

A storage system according to a further aspect of the invention includes a plurality of semiconductor storage devices; and a data reading device. The plurality of semiconductor storage devices are arranged close according to a predetermined rule. Each of the plurality of semiconductor storage devices includes a substrate, a nonvolatile storage unit arranged on the substrate for nonvolatilely storing the data, an electric power generating unit arranged on the substrate for receiving energy externally supplied in a non-contact fashion and generating internal electric power, a communication unit arranged on the substrate and being configured to receive the internal electric power and perform transmission and reception of the data by radio signals with respect to the semiconductor storage device neighboring to the device to which the communication unit belongs, and a sealing film covering exposed surfaces of the electric power generating unit, the nonvolatile storage unit and the communication unit. When the communication unit receives the data from any neighboring semiconductor storage device, the communication unit transfers the received data to any other semiconductor memory device. The data reading device includes a reading unit neighboring to at least one of the plurality of closely arranged semiconductor storage devices for receiving the data transferred from the neighboring semiconductor storage device.

Preferably, the communication unit transfers the data received from the neighboring semiconductor storage device to a destination and thereafter transmits the data stored in the nonvolatile storage device to the destination.

Preferably, each of the plurality of semiconductor storage devices is arranged close to the semiconductor storage devices. The communication unit includes a plurality of transmitting/receiving units configured to perform data transmission and data reception with respect to the semiconductor storage device neighboring to the device to which the communication unite belongs. Each of the transmitting/receiving units establishes an ad-hoc network with respect to the neighboring semiconductor storage device.

Preferably, the substrate is a light-transmitting substrate, the electric power generating unit is a solar cell for receiving light passed through the substrate and generating an electric power, and the data reading device further includes a light for emitting unit emitting the light to the plurality of semiconductor storage devices.

Preferably, the data reading device further includes a magnetic flux supply unit for supplying an alternating magnetic flux to the plurality of semiconductor storage devices, The electric power generating unit includes a coil disposed in a position causing linkage with the alternating magnetic flux, and a power supply circuit for producing the internal electric power from electromotive force generated by linkage between the coil and the alternating magnetic flux.

According to a further aspect, the invention provides a semiconductor storage device for use in a storage system formed of a plurality of semiconductor storage devices arranged close to each other according to a predetermined rule. The semiconductor memory device includes a substrate; a nonvolatile storage unit arranged on the substrate for non-volatilely storing data; an electric power generating unit arranged on the substrate for receiving energy externally supplied in a non-contact fashion and generating internal electric power; a communication unit arranged on the substrate and being configured to receive the internal electric power and perform transmission and reception of the data by radio signals with respect to the semiconductor storage device neighboring to the device to which the communication unit belongs; and a sealing film covering exposed surfaces of the electric power generating unit, the nonvolatile storage unit and the communication unit. When the communication unit receives the data from any neighboring semiconductor storage device, the communication unit transfers the received data to any other neighboring semiconductor memory device.

Effects of the Invention

The invention can provide the semiconductor storage device that has a longer life than the conventional semiconductor storage device as well as the storage system including the semiconductor storage device.

BRIEF DESCRIPTION OF THE DRAWINGS

FIG. 26 illustrates processing in the case where a network shown in FIG. 25 has a failure.

DESCRIPTION OF THE REFERENCE SIGNS 10, 10A, 10B and 10C control unit, 12 interface unit, 20, 20B and 20C light emitting unit, 30 and 30A receiving unit, 301 and 90 antenna, 302 receiving circuit, 303 transmitting/receiving circuit, 30B and 30C reading unit, 31 serial converting unit, 32 correcting circuit, 33 decoding circuit, 34 and 36 buffer unit, 35 space switch, 40 power supply unit, 42 transmitting circuit 44 receiving circuit, 46 and 46-1 to 46-6 transmitting/receiving circuit, 48-1 to 48-6 antenna, 50 and 50B solar cell, 60, 60A, 60B, 60C and 60D control circuit, 601 counter circuit, 70, 70B and 70D mask ROM, 80 and 80A transmitting/receiving circuit, 90A and 90B magnetic flux supply unit, 96 power supply circuit, 100, 100A, 100B, 100C and 100D semiconductor storage device, 102 substrate, 110 recess, 120 and 120A storage cell, 122 anti-reflection film, 124 n-type semiconductor layer, 126 p-type semiconductor layer, 128 p+ impurity semiconductor layer, 130 electrode layer, 132, 134, 136, 136B, 138B and 138 through hole, 140 and 150 insulating film, 200 portable game device, 300, 400, 400A and 500 storage system, 310 and 310A receiving cell, 410 rack

BEST MODES FOR CARRYING OUT THE INVENTION

Embodiments of the invention will now be described with reference to the drawings. In the following description, the same or corresponding portions bear the same reference numbers, and description thereof is not repeated.

First Embodiment

Figure 1:
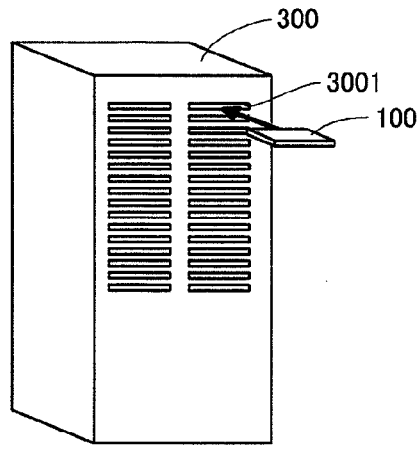
FIG. 1 shows an outer appearance of a storage system 300 according to a first embodiment of the invention.

FIG. 1 shows an outer appearance of a storage system 300 according to a first embodiment of the invention.

Referring to FIG. 1, storage system 300 according to the present embodiment functions as a kind of data accumulation device. Specifically, storage system 300 is provided at its side surface with a plurality of insertion openings 3001 for accepting a plurality of semiconductor storage devices 100. Storage system 300 reads necessary information from these semiconductor storage devices 100 and provides it to external devices (not shown). The number of semiconductor storage devices 100 that storage system 300 can accept is appropriately designed according to a required speed in each data read operation and/or a quantity of data to be accumulated.

As a typical example of application, semiconductor storage device 100 according to the present embodiment is used as a storage medium for storing data that is valuable as cultural properties such as pictorial arts and movies. Since any semiconductor storage device 100 can be inserted into storage system 300, storage system 300 may be configured such that only required devices 100 selected from among many semiconductor storage devices 100 are inserted into it.

As will be described later, the data read from each of semiconductor storage devices 100 inserted into storage system 300 is transferred toward storage system 300 by radio signals.

Figure 2:
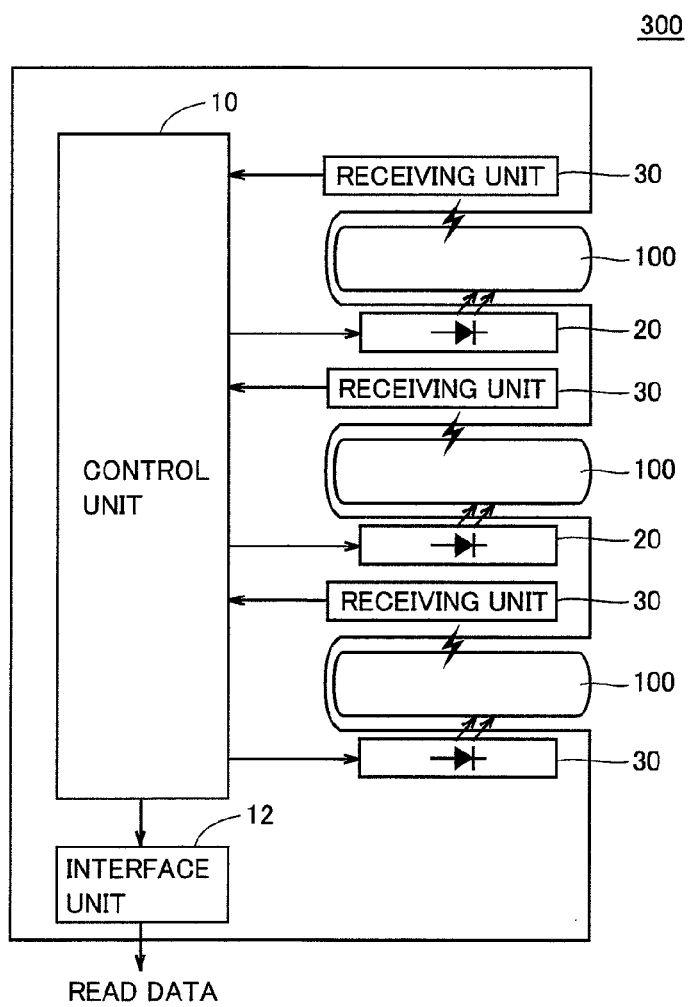
FIG. 2 schematically shows a typical sectional structure of storage system shown in FIG. 1.

FIG. 2 schematically shows a typical sectional structure of storage system 300 shown in FIG. 1. For the sake of simplicity, FIG. 2 shows a structure having only three insertion openings. However, an appropriate structure corresponding to the number of the insertion openings are practically employed.

Referring to FIG. 2, storage system 300 includes a control unit 10, a plurality of light emitting units 20, a plurality of receiving units 30 and an interface unit 12. Storage system 300 is provided at its side portion with the plurality of insertion openings for accepting semiconductor storage devices 100. Light emitting unit 20 and light receiving unit 30 are arranged on the upper and lower sides of each insertion opening, respectively.

Each light emitting unit 20 is an energy supply unit that supplies the energy to corresponding semiconductor storage device 100 in a non-contact fashion, and typically includes a light source such as an LED (Light Emitting Diode). More specifically, each light emitting unit 20 receives the electric power from the power supply unit (not shown) to generate the light, and emits the generated light toward semiconductor storage device 100 from the lower side on the sheet of the figure. Each receiving unit 30 receives the data that is transmitted from corresponding semiconductor storage device 100 receiving the light emitted from light emitting unit 20, and provides the received data to control unit 10. Control unit 10 includes a CPU and a RAM (Random Access Memory), receives the data provided from each receiving unit 30 and performs predetermined processing.

Interface unit 12 is a portion for providing to an external device (not shown) read data that is produced after it undergoes predetermined processing by control unit 10, and typically is a wired interface such as Ethernet (registered trademark), USB (Universal Serial Bus), IEEE (Institute of Electrical and Electronic Engineers) 1394, SCR (Small Computer System Interface) or RS-232C, or a wireless interface such as a wireless LAN (Local Area Network) or Bluetooth (registered trademark).

Figure 3:
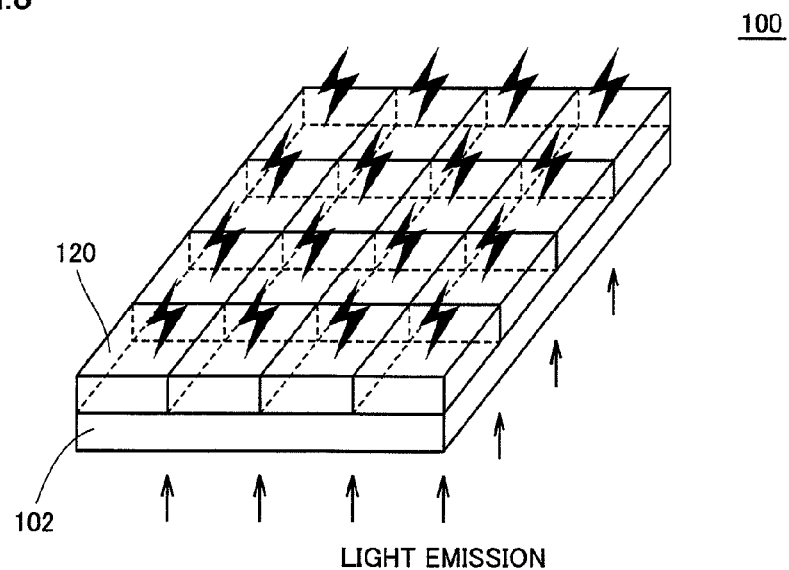
FIG. 3 schematically shows semiconductor storage device 100 according to the first embodiment of the invention.

FIG. 3 schematically shows semiconductor storage device 100 according to the first embodiment of the invention.

Referring to FIG. 3, semiconductor storage device 100 includes a plurality of storage cells 120 that are formed on a substrate 102 and are separated from each other. Substrate 102 is made of a physicochemically stable insulating substance such as silicon or glass. In an example of the structure of the present embodiment, it is made of light-transmitting glass. Further, exposed surfaces of the plurality of storage cells 120 are entirely covered with a sealing film, which is typically made of a physicochemically stable insulating substance such as a film of silicon dioxide.

Each storage cell 120 has stored the data in advance. As will be described later, each storage cell 120 receives energy from a portion outside semiconductor storage device 100 in a non-contact manner, and successively transmits (responds) the stored data as radio signals. For clearly showing the structure in which the plurality of storage cells 120 are formed, FIG. 3 schematically shows the plurality of storage cells 120 separated from each other. However, the structure in which storage cells 120 are clearly separated is not essential.

Figure 4:
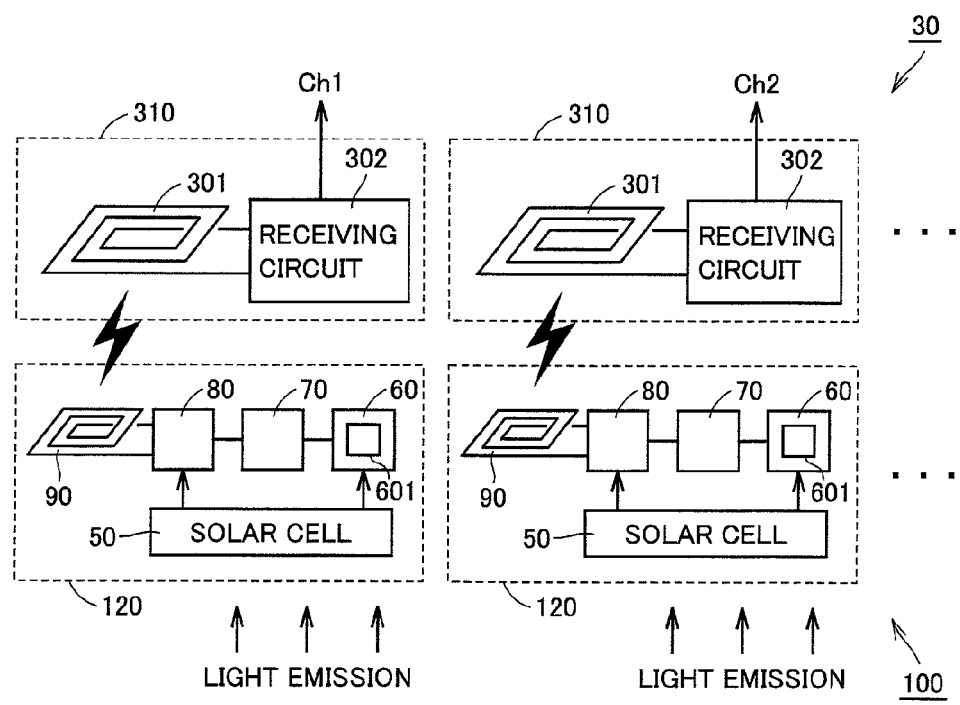
FIG. 4 is a block diagram showing functional structures of semiconductor storage device 100 and a receiving unit 30 according to the first embodiment of the invention.

FIG. 4 is a block diagram showing functional structures of semiconductor storage device 100 and receiving unit 30 according to the first embodiment of the invention.

Referring to FIG. 4, each of storage cells 120 forming semiconductor storage device 100 includes a solar cell 50, a control circuit 60, a mask ROM 70, a transmitting circuit 80 and an antenna 90.

Solar cell 50 is formed on substrate 102 (FIG. 3) side, and generates internal power by receiving the light that is emitted from light emitting unit 20 and is passed internally through substrate 102 (FIG. 3). Solar cell 50 supplies the generated internal power to control circuit 60 and transmitting circuit 80.

When solar cell 50 starts the supply of the power, control circuit 60 reads the data from mask ROM 70 in a predetermined cycle, and provides it to transmitting circuit 80. Particularly, control circuit 60 includes a counter circuit 601. When counter circuit 601 receives the internal power from solar cell 50, it resets its count and starts the count-up in a predetermined cycle. According to the count thus counted up, control circuit 60 successively designates predetermined addresses in mask ROM 70 to perform the data reading. When all the addresses in mask ROM 70 are read, control circuit 60 repeats the data read operation starting from the first address in mask ROM 70. Thus, control circuit 60 cyclically performs the data reading from mask ROM 70 as long as solar cell 50 supplies the power.

Mask ROM 70 is a nonvolatile storing unit that is provided with a circuit pattern corresponding to the data to be stored, and thereby can nonvolatilely store the data. Typically, mask ROM 70 is formed by transferring a circuit pattern, which is prepared in advance corresponding to the data, to the substrate by a stepper or the like.

Mask ROM 70 may be replaced with a PROM (Programmable Read Only Memory) that can be programmed after pattern forming. A laser PROM and a fuse-type PROM have been known as the above kind of PROM. In these laser PROM and fuse-type PROM, data can be stored by a circuit that corresponds to required data and is formed by emitting the light from a portion outside semiconductor memory device 100. Also, a PROM disclosed, e.g., in International Laying-Open No. 03/025944 brochure may be used.

Transmitting circuit 80 receives the electric power from solar cell 50 and thereby produces a modulation signal corresponding to the data that is read from mask ROM 70 by control circuit 60. Transmitting circuit 80 excites antenna 90 by this modulation signal.

Typically, antenna 90 is formed of a looped metal wire formed on the substrate, and receives the modulation signal from transmitting circuit 80 for transmitting the radio signal. Since semiconductor storage device 100 according to the present embodiment includes the plurality of storage cells 120, antenna 90 is configured such that carriers of the radio signals transmitted from respective storage cells 120 may have different frequencies so that the radio signals transmitted from respective storage cells 120 can be identified. Specifically, each antenna 90 has an impedance that can be set to an arbitrary value by adjusting a line length, a line width, a distance between neighboring lines and/or the like of the lines forming antenna 90. An appropriate difference may be set between the impedance values of antenna 90, and thereby respective modulation frequencies can be different from each other. Thereby, the frequency of the radio signal transmitted from each storage cell 120 can be identified.

Receiving unit 30 of storage system 300 includes a plurality of receiving cells 310 corresponding to storage cells 120 in semiconductor storage device 100, respectively. Each receiving cell 310 receives the radio signal transmitted from storage cell 120 corresponding to semiconductor storage device 100, and decodes the radio signal for producing the data and providing it to control unit 10 (FIG. 2).

Each receiving cell 310 includes an antenna 301 and a receiving circuit 302. Antenna 301 is configured to match antenna 90 of the corresponding storage cell 120. Therefore, each antenna 301 can selectively receive the radio signals transmitted from antenna 90 of the corresponding storage cell 120. Thus, receiving circuit 302 receives only the radio signal having specific frequency. Receiving circuit 302 performs predetermined decoding processing on the voltage signal that antenna 301 connected thereto induces by receiving the radio signal. Receiving circuit 302 successively outputs the data obtained by this decoding processing. In the following description, the data that is successively output from respective receiving circuits 302 may also be described as "Ch1, Ch2, . . . " hereinafter.

Figure 5:
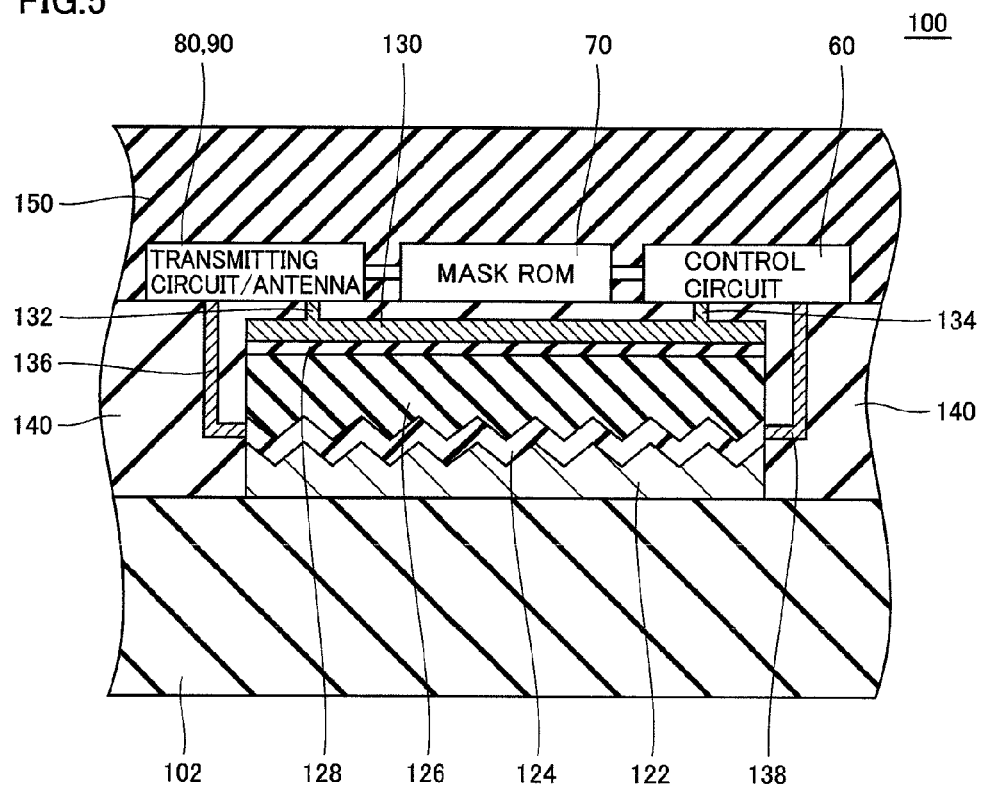
FIG. 5 schematically shows a sectional structure of semiconductor storage device 100 according to the first embodiment of the invention.

FIG. 5 schematically shows a sectional structure of semiconductor storage device 100 according to the first embodiment of the invention.

Referring to FIG. 5, semiconductor storage device 100 includes a substrate 102, an anti-reflection film 122, an n-type semiconductor layer 124, a p-type semiconductor layer 126, a p+ impurity semiconductor layer 128, an electrode layer 130, through holes 132, 134, 136 and 138, and insulating films 140 and 150.

Specifically, n-type semiconductor layer 124 is formed in a predetermined region on substrate 102 that is made of light-transmitting glass primarily made of silicon dioxide. N-type semiconductor layer 124 is made of silicon or germanium doped with n-type impurities. Anti-reflection film 122 is formed on the lower side of n-type semiconductor layer 124. P-type semiconductor layer 126 is formed on the upper side of n-type semiconductor layer 124. P+ impurity semiconductor layer 128 is formed on the upper side of p-type semiconductor layer 126. Thus, n-type, p-type and p+ impurity semiconductor layers 124, 126 and 128 form a solar battery cell of the pn-junction type. The light emitted from light emitting unit 20 (FIG. 2) located under semiconductor storage device 100 passes through substrate 102, and then is applied to n-type semiconductor layer 124 through anti-reflection film 122. This light excites electrons in n-type semiconductor layer 124 so that photovoltaic power occurs between n-type and p+ semiconductor layers 124 and 128 according to the quantity of emitted light. This electromotive force supplies the electric power to each circuit.

Control circuit 60, mask ROM 70, transmitting circuit 80 and antenna 90 are formed on the upper side of the solar cell. A part of the power generated in the solar cell is supplied to control circuit 60 via through hole 138 connected to n-type semiconductor layer 124 and via through hole 134 connected to electrode layer 130 arranged on the upper side of p+ impurity semiconductor layer 128. Also, a part of the power generated by the solar cell is supplied to transmitting circuit 80 via through hole 136 connected to n-type semiconductor layer 124 and via through hole 132 connected to electrode layer 130.

An insulating layer 140 is formed between the solar cells of a certain storage cell 120 and the solar cell of neighboring storage cell 120 so that these storage cells are electrically isolated from each other.

Further, the surface of semiconductor storage device 100 is sealed with an insulating film 150. Thus, the surface of semiconductor storage device 100 is entirely covered with insulating film 150 to prevent entry of the atmosphere. Insulating film 150 is typically made of physicochemically stable glass or silicon dioxide.

The correspondence between the structures shown in FIGS. 1 to 5 and the present invention is as follows. Substrate 102 corresponds to the "substrate", mask ROM 70 corresponds to the "nonvolatile storing unit", solar cell 50 corresponds to the "electric power generating unit" and transmitting circuit 80 corresponds to the "transmitting unit". Also, insulating film 150, light emitting unit 20 and receiving unit 30 correspond to the "sealing film", "energy supply unit" and "receiving unit", respectively.

Figure 6:
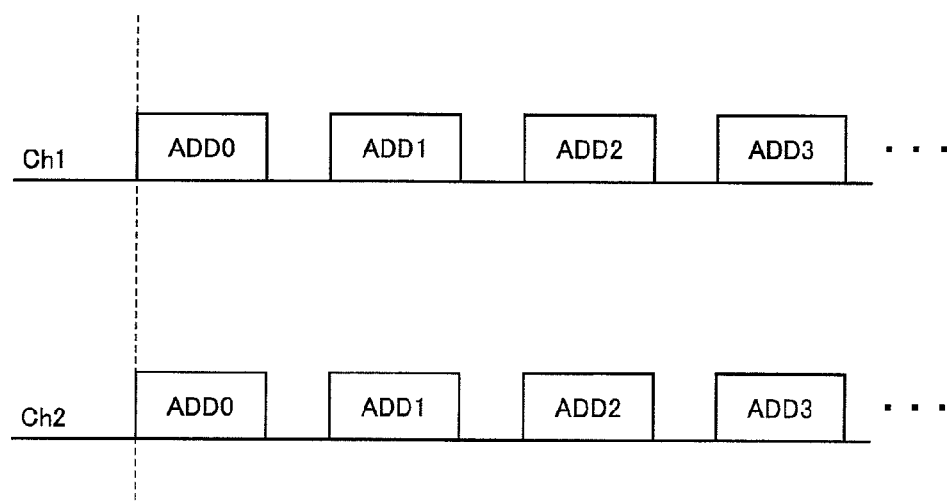
FIG. 6 illustrates an example of data read from semiconductor storage device 100 according to the first embodiment of the invention.

FIG. 6 illustrates an example of the data read from semiconductor storage device 100 according to the first embodiment of the invention.

Referring to FIG. 6, when light emitting unit 20 (FIG. 2) starts the light emission to each storage cell 120 in semiconductor storage device 100, counter circuit 601 included in control circuit 60 of storage cell 120 resets its count, and starts an operation of successively reading the data starting from the first address in corresponding mask ROM 70. Consequently, the data starting from the first address of corresponding mask ROM 70 is successively read from each storage cell 120. Thus, in certain storage cell 120, after certain data at an address ADD0 in the corresponding mask ROM is read, the data is read from next address ADD1, and subsequently the data will be read in a similar manner.

Figure 7:
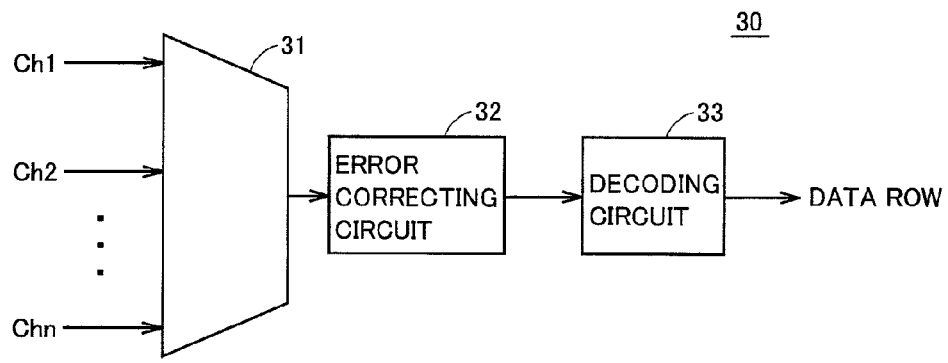
FIG. 7 is a functional block diagram showing an example of a control structure in receiving unit 30 of storage system 300 according to the first embodiment of the invention.

FIG. 7 is a functional block diagram showing an example of a control structure in receiving unit 30 of storage system 300 according to the first embodiment of the invention.

A control structure shown in FIG. 7 is employed for reading out the stored data when information (data row) to be stored is assigned to each storage cell 120 of semiconductor storage device 100 according to the order of the address. Receiving unit 30 includes functions serving as a parallel-serial converting unit 31, an error correcting circuit 32 and a decoding circuit 33.

Parallel-serial converting unit 31 serially outputs, as a one-dimensional data, the data row (Ch1, Ch1, . . . ) provided in parallel from the respective storage cells 120. Thus, parallel-serial converting unit 31 outputs the data row in the order of first data of Ch1, first data of Ch2, . . . , second data of Ch1, second data of Ch2, . . . . Error correcting circuit 32 performs predetermined error correction processing on the data column provided from parallel-serial converting unit 31. An error correction method called LDPC (Low Density Parity Check) can be used as a method of the above error correction. For performing the above error correction, it is necessary to determine the data to be stored, in advance, in each mask ROM 70 of storage cell 120 after adding error correction codes to the data to be stored in semiconductor storage device 100. By adding the error correction codes, the data reading can be continued even when a failure or the like occurs in the structures for transmitting and receiving the radio signals.

Figure 8:
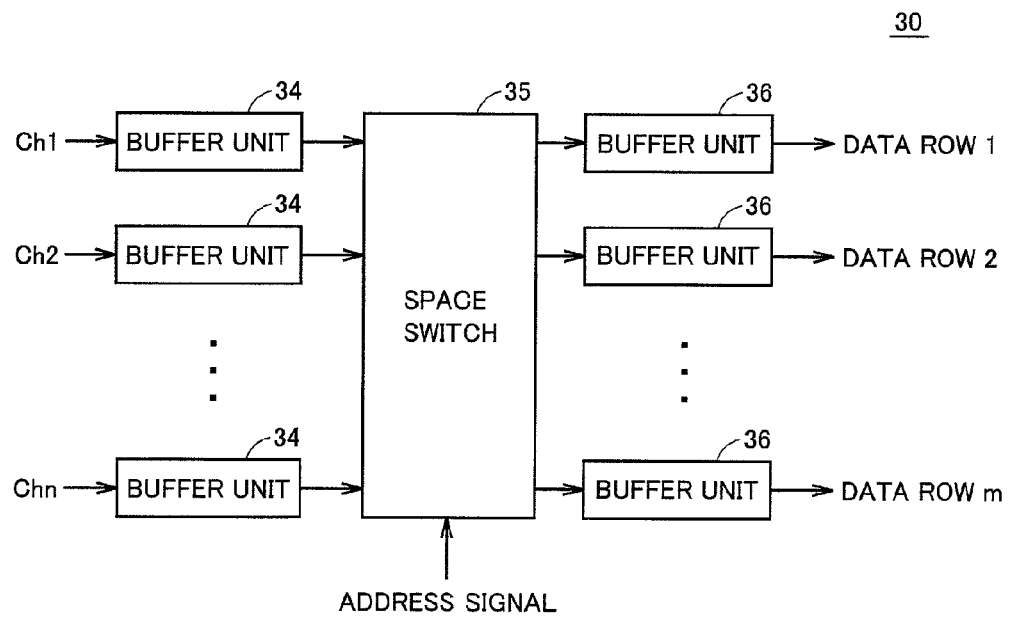
FIG. 8 is a functional block diagram showing another example of a control structure in receiving unit 30 of storage system 300 according to the first embodiment of the invention.

FIG. 8 is a functional block diagram showing another example of the control structure in receiving unit 30 of storage system 300 according to the first embodiment of the invention.

The control structure shown in FIG. 8 is employed for randomly reading the stored data in the state where the information to be stored is assigned to respective storage cells in semiconductor storage device 100. Receiving unit 30 includes a plurality of buffer units 34 and 36, and a space switch 35.

Each buffer unit 34 temporarily stores the data that is successively read from the corresponding storage cell 120. Space switch 35 selectively extracts the data stored in buffer unit 34 according to the address signal provided from control unit 10 and others, and provides the extracted data to specific buffer unit 36. Thus, space switch 35 selectively extracts the required data from the data that is read in the order of address from each storage cell 120, and provides it to specific buffer unit 36. Buffer unit 36 temporarily stores the data provided from space switch 35, and will output it as the data row when buffer unit 36 has stored a predetermined amount of data. Since the plurality of buffer units are arranged on each of the input and output sides, the data stored in storage cell 120 can be read randomly, and the discretely stored data can be combined to output it as one data row.

Description will now be given on forms of data storage and use of semiconductor storage device 100 according to the present embodiment.

Figure 9:
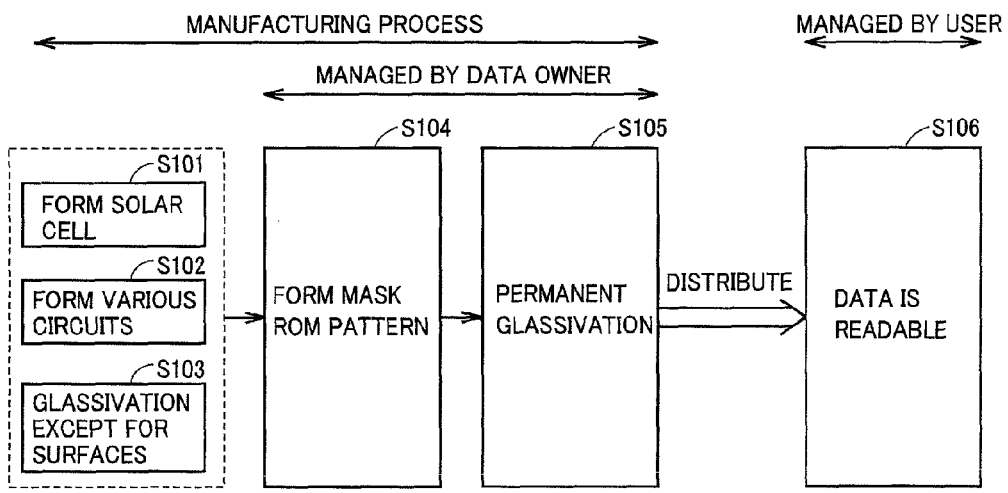
FIG. 9 shows an example of a processing procedure for data flow using semiconductor storage device 100 according to the first embodiment of the invention.
Figure 10:
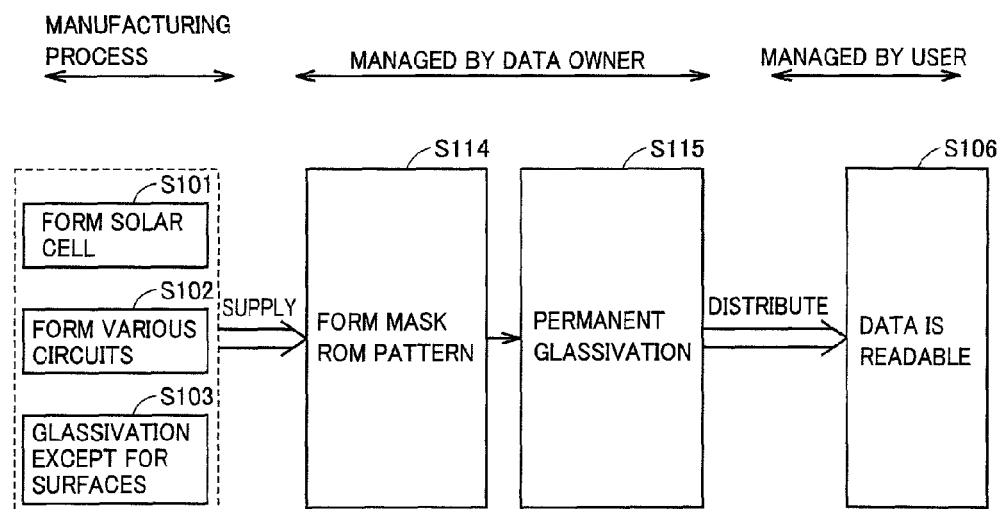
FIG. 10 shows another example of the processing procedure for data flow using semiconductor storage device 100 according to the first embodiment of the invention.

FIG. 9 shows an example of a processing procedure for data flow using semiconductor storage device 100 according to the first embodiment of the invention. FIG. 10 shows another example of the processing procedure for data flow using semiconductor storage device 100 according to the first embodiment of the invention.

FIG. 9 shows a form in which the operations from the start to the data storing are performed under management of a data owner (typically, a copyright holder) in the process of manufacturing semiconductor storage device 100. Specifically, for manufacturing semiconductor storage device 100, formation of the solar cell on substrate 102 (step S101), formation of each circuit in the layer above the solar cell (step S102) and glassivation of portions except for the surfaces of the formed circuits (step S103) are successively performed. The glassivation means the processing of forming a sealing film such as an insulating film. For keeping the state allowing data writing into the mask ROM, the glassivation is not performed on the surfaces of the formed circuits.

After semiconductor storage device 100 is manufactured as described above, pattern formation is performed on the mask ROM according to the data to be stored under the management of the data owner (step S104). Further, the glassivation is performed on the exposed surface of semiconductor storage device 100 (step S105). At this point in time, semiconductor storage device 100 is entirely packaged. Semiconductor storage devices 100 storing the data are distributed to the users.

Semiconductor storage device 100 distributed to the user is kept in a state where the data can be freely read out by a predetermined data reading device or the like (step S106).

FIG. 10 shows a form in which the data owner arbitrarily performs the processing of storing the data in semiconductor storage device 100 after the manufacturing of semiconductor storage device 100. Specifically, for manufacturing semiconductor storage device 100, formation of the solar cell on substrate 102 (step S101), formation of each circuit in the layer above the solar cell (step S102) and glassivation of portions except for the surfaces of the formed circuits (step S103) are successively performed. After these steps, semiconductor storage device 100 is supplied to the data owner.

The data owner performs pattern formation on the mask ROM according to the data to be stored (step S114). Processing the circuit pattern on the mask ROM requires a relatively massive apparatus, it is appropriate that the data owner configures the mask ROM from a laser PROM or fuse-type PROM, and creates the required circuit patter, using laser or the like. When the data owner completes the pattern formation on the mask ROM, the owner then performs the glassivation on the entire surface of semiconductor storage device 100 (step S115). Semiconductor storage devices 100 storing the data are distributed to the users.

Semiconductor storage device 100 distributed to the user is kept in a state where the data can be freely read out by a predetermined data reading device or the like (step S106).

The embodiment employs the structure in which the mask ROM for nonvolatilely storing the data and the peripheral circuits for reading the data from the mask ROM are formed on the substrate, and then the exposed surfaces of them are covered with the physicochemically stable sealing film. This can suppress corrosion by the atmosphere, and can implement the data holding for a longer period.

According to the present embodiment, since the externally supplied energy is used for performing the reading operation and others, the circuit structure can be simple. By employing the glass substrate having the light-transmitting property, the solar cell formed on this substrate can be used to supply the electric power. A silicon substrate or the like is electrically conductive to a certain extent, but the glass substrate is a better insulator and therefore has smaller absorptance and higher transmittance of electromagnetic waves so that the glass substrate allows the efficient data communications with smaller transmission power.

Modification of the First Embodiment

The above embodiment has been described in connection with the example of the semiconductor storage device including the solar cell that generates the internal power by receiving the externally emitted light. Instead of this structure, a passive type of radio system may be employed.

Figure 11:
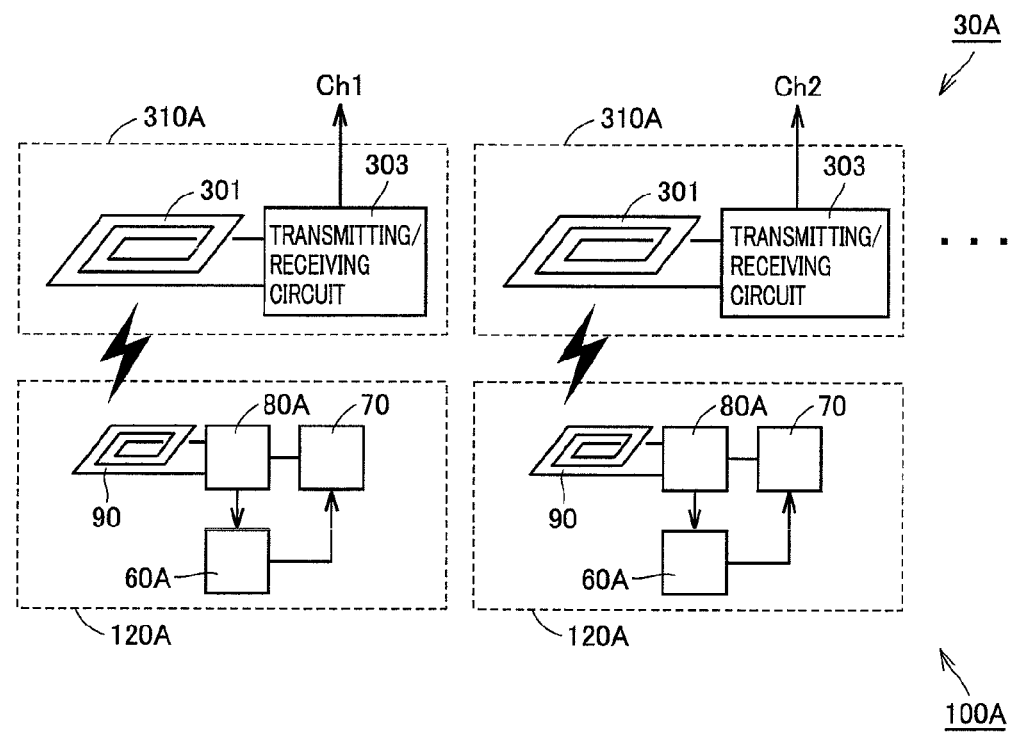
FIG. 11 is a block diagram showing functional structures of a semiconductor storage device 100A and a receiving unit 30A according to a modification of the first embodiment of the invention.

FIG. 11 is a block diagram showing functional structures of a semiconductor storage device 100A and a receiving unit 30A according to a modification of the first embodiment of the invention.

Referring to FIG. 11, each storage cell 120A differs from storage cell 120 shown in FIG. 4 in that solar cell 50 is removed, transmitting circuit 80 is replaced with a transmitting/receiving circuit 80A, and control circuit 60 is replaced with a control circuit 60A. This storage cell 120A is of the passive type in which when storage cell 120A externally receives a radio signal, the internally stored data responds to it.

More specifically, when the radio signal for performing the data reading from a corresponding receiving cell 310A is transmitted, transmitting/receiving circuit 80A receives this radio signal through antenna 90. Transmitting/receiving circuit 80A takes out the electric power and identification information from the radio signal provided from receiving cell 310A, and provides it to control circuit 60A. Control circuit 60A becomes active in response to reception of the power from receiving cell 310A, and reads the data from the predetermined address in mask ROM 70 according to the input identification information provided from receiving cell 310A. The data thus read is provided to transmitting/receiving circuit 80A. Transmitting/receiving circuit 80A uses a part of the radio signal received by antenna 90 to modulate the radio signal with the data read from mask ROM 70, and transmits it.

Receiving cell 310A includes antenna 301 and a transmitting/receiving circuit 303. Transmitting/receiving circuit 303 produces the radio signals for reading the data from storage cell 120A, and transmits it from antenna 301. Also, transmitting/receiving circuit 303 produce the data by decoding the radio signal that is provided from storage cell 120A and received by antenna 301, and outputs it.

In the above manner, receiving cell 310A according to the modification of the present embodiment performs the data reading from storage cell 120A.

According to the above modification, it is possible to achieve substantially the same effect as that of the first embodiment already described. Also, the radio signal supplies the electric power and the radio signal performs the data reading so that it is possible to apply a design to the surface of semiconductor storage device 100.

Second Embodiment

Figure 12:
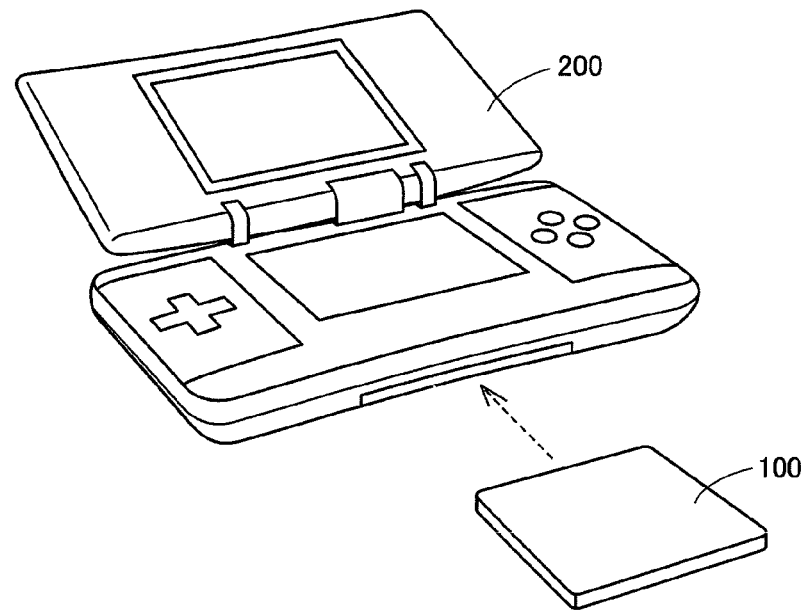
FIG. 12 shows an outer appearance of an example of a structure using a storage system according to a second embodiment of the invention.

FIG. 12 shows an outer appearance of an example of a structure using a storage system according to a second embodiment of the invention. Referring to FIG. 12, semiconductor storage device 100 according to the second embodiment is used, by way of example, as a recording medium for storing an application executed by a portable game device 200. More specifically, semiconductor storage device 100 nonvolatilely stores program codes to be executed by a processing device such as a CPU (Central Processing Unit) of portable game device 200 as well as various kinds of data. Portable game device 200 includes a data reading device for reading the data from semiconductor storage device 100. When semiconductor storage device 100 is inserted into portable game device 200, information is read therefrom.

Figure 13:
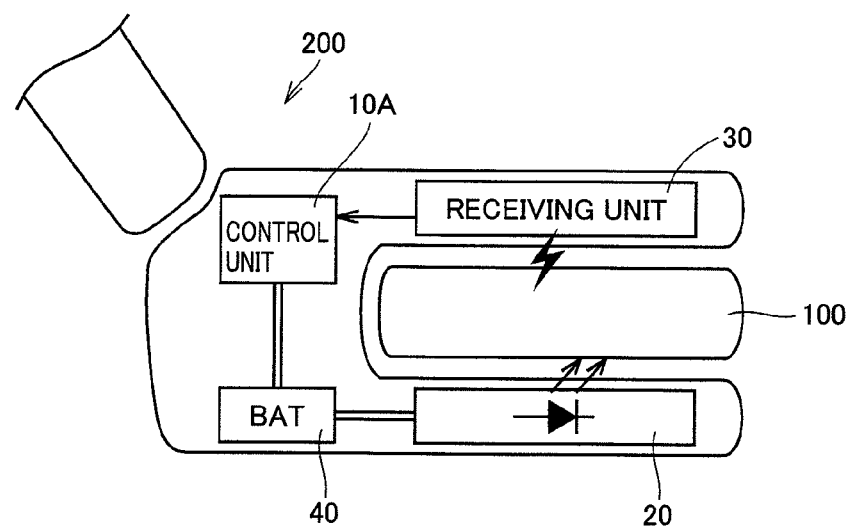
FIG. 13 schematically shows a sectional structure of a portable game device 200 shown in FIG. 12.

FIG. 13 schematically shows a sectional structure of portable game device 200 shown in FIG. 12.

Referring to FIG. 13, portable game device 200 includes a control unit 10A, light emitting unit 20, receiving unit 30 and a power supply unit (BAT) 40. Portable game device 200 is provided on its body side with a recess for inserting semiconductor storage device 100. Light emitting unit 20 and receiving unit 30 are arranged on the lower and upper sides of the recess.

Light emitting unit 20 is an energy supply unit that supplies the energy to semiconductor storage device 100 in a non-contact fashion. Light emitting unit 20 generates light from the electric power supplied from power supply unit 40, and emits the generated light from its lower side in the sheet of the figure toward semiconductor storage device 100. Receiving unit 30 receives the transmitted data by receiving the light emitted from light emitting unit 20 by semiconductor storage device 100, and provides the received data to control unit 10A. Control unit 10A includes a CPU, a RAM, a display circuit and the like, receives the data provided from receiving unit 30 and executes the predetermined processing. Power supply unit 40 is typically formed of a storage battery, and supplies drive power to light emitting unit 20 and control unit 10A.

Structures and processing other than the above are substantially the same as those of the first embodiment, and therefore description thereof is not repeated.

According to the present embodiment, it is possible to achieve substantially the same effect as that in the first embodiment already described. Also, the data is read in the non-contact fashion from semiconductor storage device 100 so that it is possible to achieve the effect of improving the resistance to mechanical abrasion, chemical rusting and damages due to static electricity. Further, it is possible to achieve the effect of improving the resistance to reverse engineering, modification or the like.

In the examples that have been described as the first and second embodiments, the circuits are formed on the substrate of a rectangular form that is formed or shaped in advance. However, as an example of the structure for increasing the storage capacity, circuits for implementing the semiconductor storage device according to the invention may be formed on a silicon wafer of a circular disk-like form prepared by crystal growth.

Third Embodiment

Figure 14:
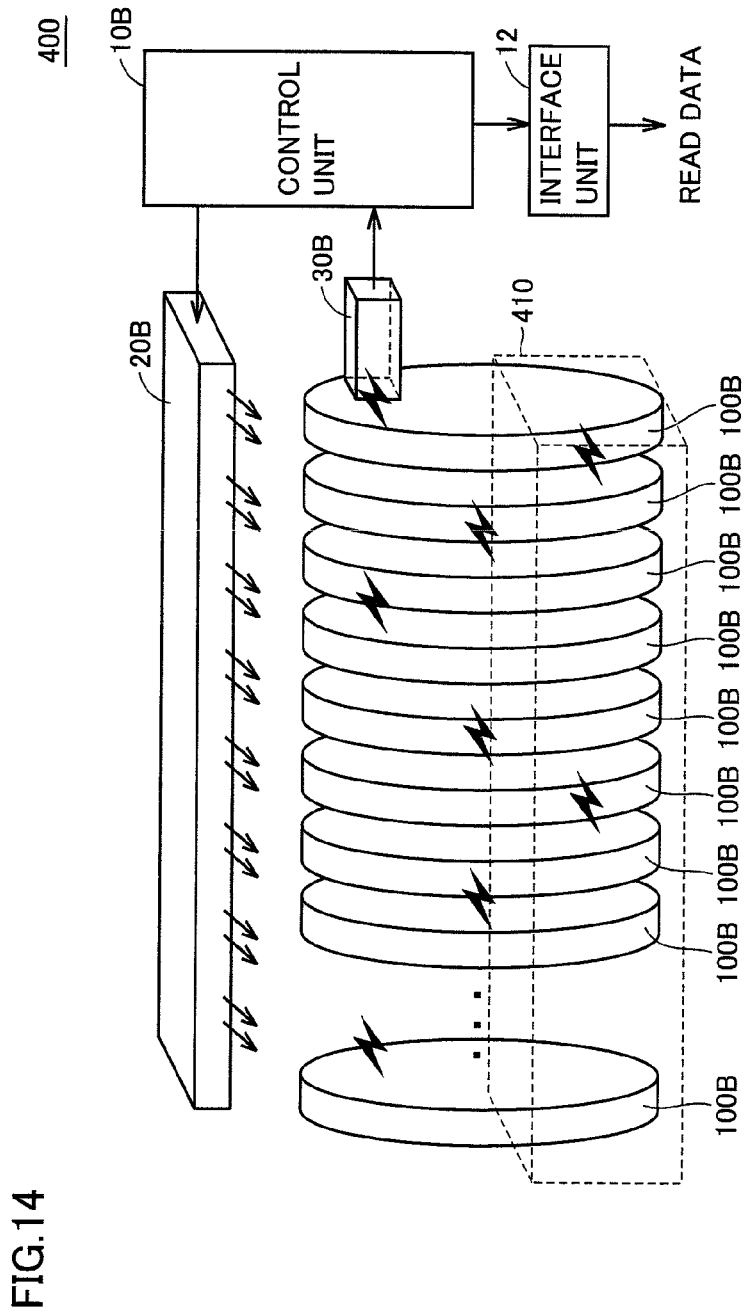
FIG. 14 shows an outer appearance of a storage system 400 according to a third embodiment of the invention.

FIG. 14 shows an outer appearance of a storage system 400 according to a third embodiment of the invention.

Referring to FIG. 14, a storage system 400 according to the third embodiment includes a plurality of semiconductor storage devices 100B, a rack 410 accommodating these semiconductor storage devices 100B, a light emitting unit 20B emitting the light to these semiconductor storage devices 100B, a reading unit 30B arranged close to semiconductor storage device 100B located on one end, a control unit 10B, and interface unit 12. Rack 410, light emitting unit 20B, reading unit 30B, control unit 10B and interface unit 12 function as a "data reading device".

Each of semiconductor storage devices 100B includes a nonvolatile storage unit such as a mask ROM, peripheral circuits performing data reading from the mask ROM and radio transmission thereof, and an electric power generating unit that generates internal electric power by receiving energy supplied from the outside of the battery cell in a non-contact fashion, and these are formed on a silicon wafer of a substantially circular disk-like form. Rack 410 accommodates these semiconductor storage devices 100B that are arranged close to each other according to a predetermined rule.

Semiconductor storage device 100B according to the present embodiment can typically perform autonomous communications like an ad-hoc network between neighboring semiconductor memory devices 100B. Specifically, in storage system 400 according to the present embodiment, when light emitting unit 20B starts the light emission toward semiconductor storage devices 100B, each semiconductor storage device 100B transmits by radio the data received from any neighboring semiconductor storage device 100B to any other neighboring, i.e., other semiconductor storage device 100B, and also transmits by radio the data stored in itself to the neighboring semiconductor storage device 100B. Consequently, the data items stored in respective semiconductor storage devices 100B are successively transmitted in a certain direction according to the arrangement rule of semiconductor storage devices 100B. The data transmitted from semiconductor storage device 100B located at the downstream end in the above transmission direction is received by reading unit 30B, and is externally output through control unit 10B from interface unit 12.

As described above, semiconductor storage device 100B according to the present embodiment transmits the data in the autonomous or self-controlled fashion. Therefore, any restriction is imposed in number and order of positions thereof in rack 410, and the addition and exchange of semiconductor storage devices 100B can be easily performed when necessary provided that semiconductor storage devices 100B are arranged close to each other.

Light emitting unit 20B is substantially the same as light emitting unit 20 except for the light emission area, and therefore description thereof will not be repeated. Since interface unit 12 is already described, description thereof is not repeated.

Control unit 10B classifies or groups the data items successively transmitted from the plurality of semiconductor storage devices 100B based on the IDs thereof or the like, temporarily accumulates the classified data in the internal memory or the like, and will output the required data from interface unit 12 when it receives an external request.

Figure 15:
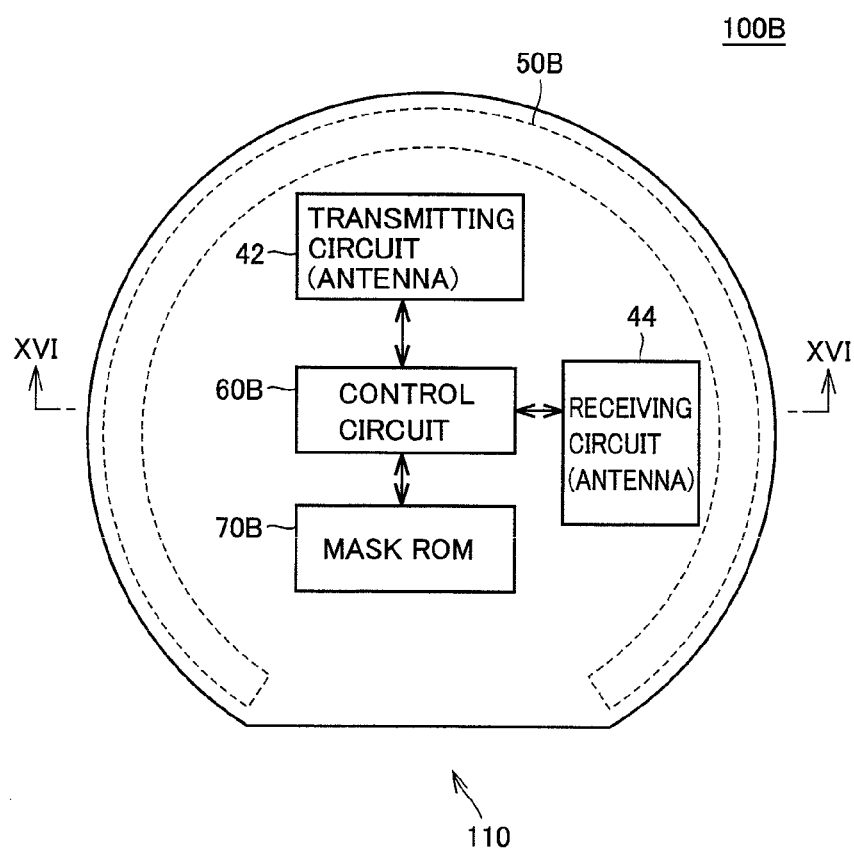
FIG. 15 is a block diagram showing a planar structure of a semiconductor storage device 100B according to the third embodiment of the invention.
Figure 16:
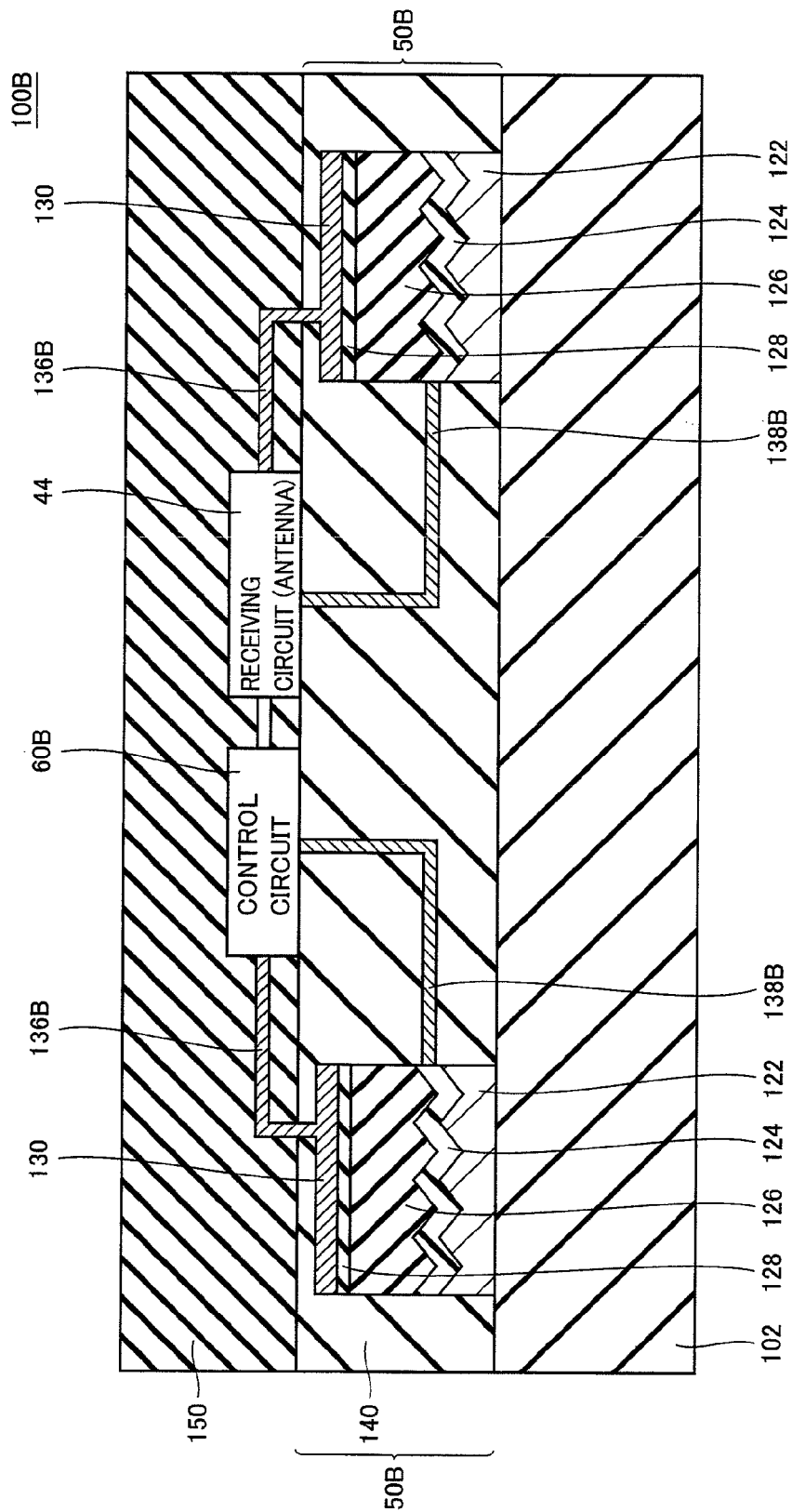
FIG. 16 is a sectional view taken along line XVI-XVI of semiconductor storage device 100B shown in FIG. 15.

FIG. 15 is a block diagram showing a planar structure of semiconductor storage device 100B according to the third embodiment of the invention. FIG. 16 is a sectional view taken along line XVI-XVI of semiconductor storage device 100B shown in FIG. 15.

Referring to FIG. 15, each semiconductor storage device 100B includes a solar cell 50B, a control circuit 60B, a mask ROM 70B, a transmitting circuit 42 including the antenna for transmission, and a receiving circuit 44 including the antenna for reception. Each of transmitting circuit 42 and receiving circuit 44 functions as a "communication unit". Each of these portions and units is formed on the substrate (wafer), and the exposed surfaces thereof are entirely covered with a sealing film (typically, a physicochemically stable insulating substance such as a silicon dioxide film).

For example, solar cell 50B has a substantially U-shaped or horseshoe-shaped form, is formed on the light-transmitting wafer and generates the internal electric power by receiving the light emitted from light emitting unit 20B (FIG. 14). The internally generated power is supplied to control circuit 60B, transmitting circuit 42, receiving circuit 44 and the like. Semiconductor storage device 100B according to the present embodiment of the invention is arranged to locate its flat plane close to the planes of different semiconductor storage devices 100B. For effectively receiving the light emitted from light emitting unit 20B (FIG. 14) in the above arrangement, solar cell 50B is formed on the outer periphery side of semiconductor storage device 100B. Although FIG. 15 shows a structure in which solar cell 50B is formed on one surface remote from the surface bearing other circuits. However, solar cells 50B may be formed on the opposite surfaces, respectively, for generating larger internal power.

When solar cell 50B starts the power supply, control circuit 60B cooperates with transmitting circuit 42 and receiving circuit 44 to form the ad-hoc network with respect to other semiconductor storage devices 100B. Specifically, when receiving circuit 44 receives the data transmitted from any neighboring semiconductor storage device 100B, control circuit 60B transmits this data received from transmitting circuit 42 to any other neighboring semiconductor storage device 100B. Thus, control circuit 60B functions as a relay device transmitting the data from semiconductor storage device 100B neighboring to itself to other neighboring semiconductor storage device 100B. In addition to this relay operation, control circuit 60B reads the data from mask ROM 70B and provides it to transmitting circuit 42 so that semiconductor storage device 100 transmits the data stored in itself to other semiconductor storage device 100B. More specific communication processing will be described later in detail.

Since mask ROM 70B has substantially the same structure as mask ROM 70 already described, description thereof is not repeated.

Transmitting circuit 42 receives the power from solar cell 50B, and control circuit 60B produces the modulation signal according to the data read from mask ROM 70B. Transmitting circuit 42 excites the antenna (not shown) by this modulation signal, and thereby transmits the radio signal (modulation signal) to a neighboring semiconductor storage device 100B.

When receiving circuit 44 receiving the power from solar cell 50B receives the radio signal form another semiconductor storage device 100B through the antenna (not shown), it decodes the radio signal into data, and provides it to control circuit 60B.

In each of semiconductor storage devices 100B according to the present embodiment of the invention, since the transmission of the radio signal and the reception of the radio signal are performed independently of each other, transmitting circuit 42 and receiving circuit 44 are spaced by a predetermined distance on the wafer surface for preventing interference between the radio signals thereof.

Referring to FIG. 16, semiconductor storage device 100B has substantially the same sectional structure as semiconductor storage device 100 according to the first embodiment shown in FIG. 5, and is formed of substrate 102, anti-reflection film 122, n-type semiconductor layer 124, p-type semiconductor layer 126, p+ impurity semiconductor layer 128, electrode layer 130, through holes 136B and 138B, and insulating films 140 and 150.

Specifically, solar cell 50B is formed on a predetermined region of substrate 102 mode of light-transmitting glass that is primarily made of silicon dioxide. In solar cell 50B, n-type semiconductor layer 124, p-type semiconductor layer 126 and p+ impurity semiconductor layer 128 form the solar battery cell of the pn-junction type. The light emitted from light emitting unit 20B (FIG. 15) is passed through substrate 102, and is emitted through anti-reflection film 122 to n-type semiconductor layer 124. This light excites the electrons in n-type semiconductor layer 124, so that an electromotive force occurs between n-type semiconductor layer 124 and p+ semiconductor layer 128 according to the quantity of emitted light. This electromotive force supplies the electric power via through holes 136B and 138B to control circuit 60B, receiving circuit 44 and transmitting circuit 42 (FIG. 15).

In semiconductor storage device 100B, as shown in FIG. 16, solar cell 50B is formed in the region surrounded by substrate 102 and insulating film 140, and insulating film 150 sealingly covers the exposed surfaces of control circuit 60B and others formed on the upper surface of insulating film 140. Therefore, the surface of semiconductor storage device 100B is entirely covered with insulating film 150 of the physicochemically stable glass or silicon dioxide to prevent entry of the atmosphere.

Figure 17:
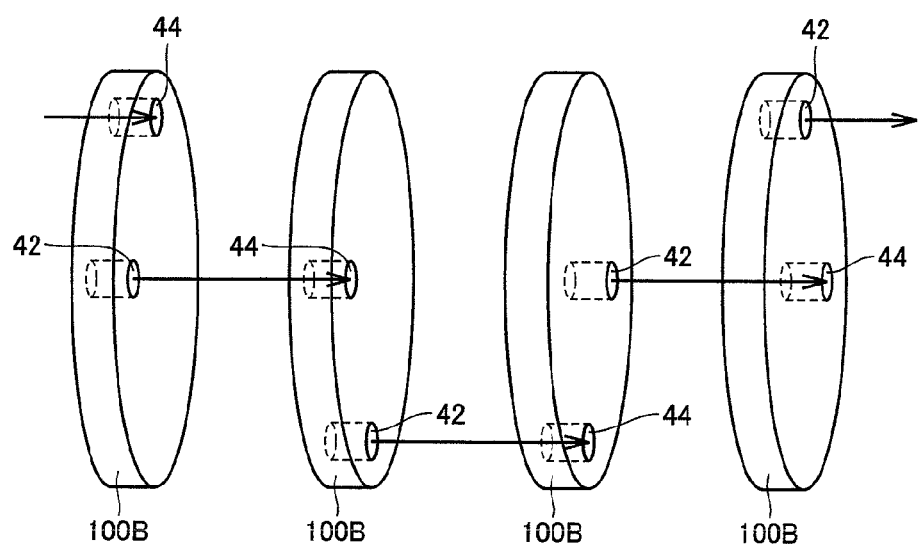
FIG. 17 schematically shows a state of data transfer in storage system 400 according to the third embodiment of the invention.

FIG. 17 schematically shows a state of data transfer in storage system 400 according to the third embodiment of the invention.

Referring to FIG. 17, in storage system 400 according to the present embodiment, the plurality of semiconductor storage devices 100B are accommodated in rack 410 (FIG. 14) and are adjacent to each other so that the centers of their circular forms may be located on the same straight line. As shown in FIG. 15, each semiconductor storage device 100B has transmitting circuit 42 and receiving circuit 44 that are formed on the same circular surface and are spaced from each other by a predetermined circumferential angle.

Accordingly, neighboring semiconductor storage devices 100B are angularly shifted by the above predetermined circumferential angle from each other so that transmitting circuit 42 and receiving circuit 44 formed in one and the other of neighboring semiconductor storage devices 100B, respectively, can be adjacent to each other. Typically, FIG. 17 shows the case where semiconductor storage devices 100B are successively arranged to keep a positional relationship in which neighboring semiconductor storage devices 100B are angularly and relatively shifted by 90 degrees from each other.

The ad-hoc network can be formed by the plurality of semiconductor storage devices 100B that are arranged to provide the positional relationship shown in FIG. 17. Thus, in the structure shown in FIG. 17, the data is transmitted unidirectionally from semiconductor storage device 100B on the left side of the sheet of FIG. 17 toward that on the right side of the sheet.

In each semiconductor storage device 100B, transmitting circuit 42 and receiving circuit 44 are spaced by a predetermined distance from each other for preventing interference between the received or transmitted radio signals. Further, the intensity of the radio signal transmitted from each transmitting circuit 42 is set so that only nearest receiving circuit 44 can receive it. Thus, the intensity is set such that the radio signal transmitted from certain transmitting circuit 42 to neighboring semiconductor memory device 100B may not affect receiving circuit 44 of another semiconductor memory device 100B.

FIG. 17 typically shows the example of the structure in which transmitting and receiving circuits 42 and 44 are circumferentially spaced by 90 degrees. However, this circumferential angle is not restricted to it provided the above conditions are satisfied.

It is preferable that the foregoing positional relationship of the plurality of semiconductor storage device 100B can be implemented easily. In the present embodiment, therefore, each semiconductor storage device 100B is provided with a recess 110 (FIG. 15) for specifying the relative positional relationship so that the above positioning may be performed easily. Thus, in each slot of rack 410 (FIG. 15) accommodating semiconductor storage devices 100B, a projection engageable with recess 110 is formed in an appropriate position. This structure can implement the positional relationship that ensures the radio communications between neighboring semiconductor storage devices 100B.

By employing the above structure, even a user having no expertise can easily add new semiconductor storage device 100B (i.e., new contents). Also, there is no restriction on the order of arrangement of semiconductor storage devices 100B.

A topology of the ad-hoc network of storage system 400 shown in FIG. 17 is one-dimensional. Therefore, storage system 400 according to the present embodiment is configured as follows. Storage system 400 transmits the data only in one direction. Also, each semiconductor storage device 100B that is present downstream from certain semiconductor storage device 100B transmits the data received from the upstream side to the downstream side with priority, and will transmit the data stored in itself after the completion of the above received data. A communication sequence relating to this data transmission will be described with reference to FIG. 18.

Figure 18:
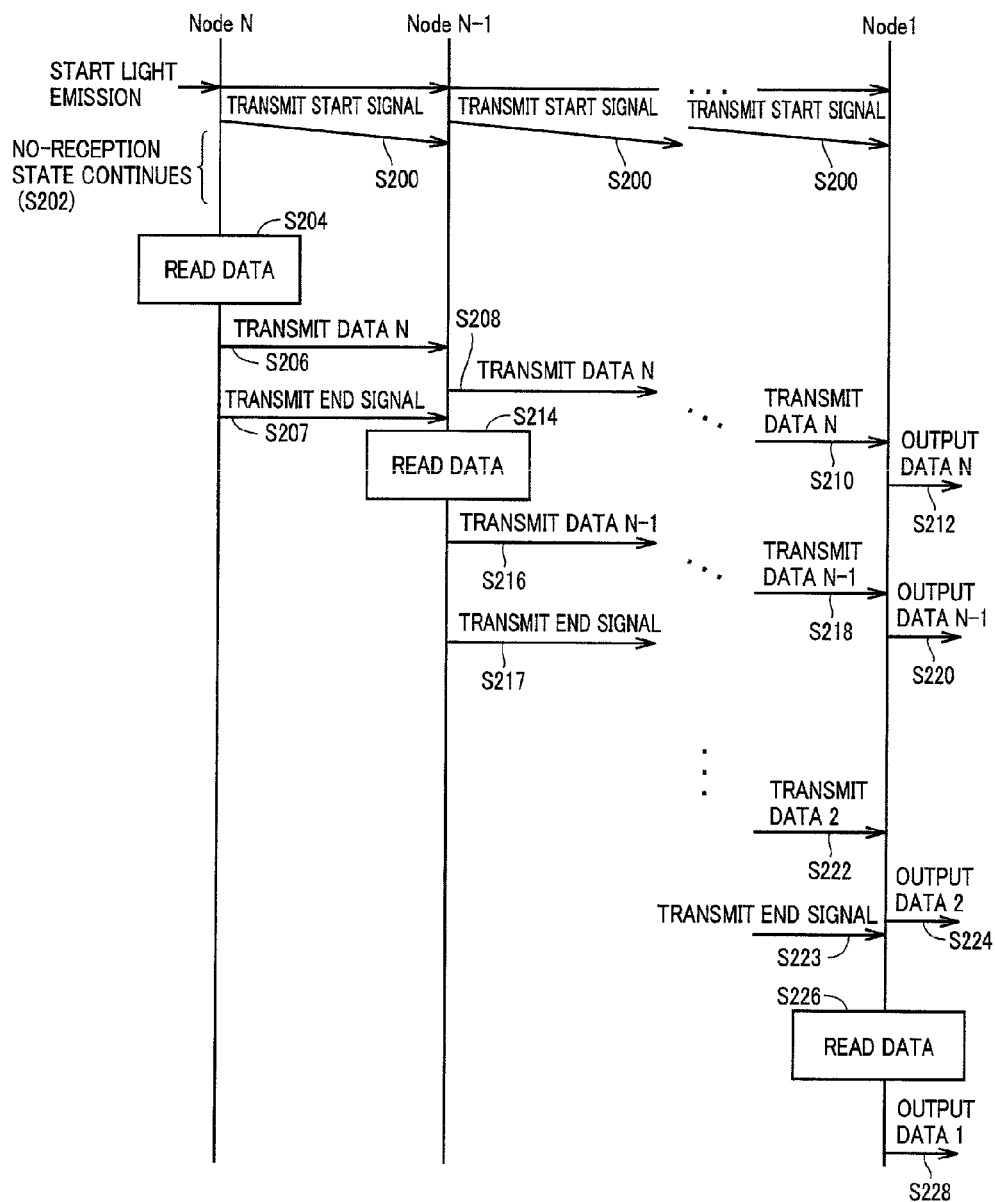
FIG. 18 shows a communication sequence in a storage system 400 according to the third embodiment of the invention.

FIG. 18 shows the communication sequence in storage system 400 according to the third embodiment of the invention. In FIG. 18, it is assumed that semiconductor memory devices 100B of N in number are arranged, and are referred to as Node 1, . . . Node N-1 and Node N in the order of arrangement from the side near reading unit 20B (FIG. 15) to the other side.

Referring to FIG. 18, when light emitting unit 20B (FIG. 15) starts the light emission to semiconductor storage devices 100B of N in number, each semiconductor storage device 100B is activated to start the processing. In storage system 400 according to the present embodiment, semiconductor storage device 100B located in the upstream end is determined or specified based on whether semiconductor storage device 100B receives a "start signal" from another semiconductor storage device 100B or not. Thus, a non-receiving state in which the "start signal" is not received from another semiconductor storage device 100B continues in certain semiconductor storage device 100B for a predetermined period after the start of light emission, semiconductor storage device 100B determines that semiconductor storage device 100B itself is located in the upstream end, and transmits the data stored in itself to downstream semiconductor storage device 100B. When the data transmission is completed, semiconductor storage device 100B itself subsequently transmits the "end signal" to semiconductor storage device 100B on the downstream side. Conversely, when semiconductor storage device 100B itself receives the "start signal" from another semiconductor storage device 100B within a predetermined period after the start of the light emission, it determines that another semiconductor storage device 100B is present on the upstream side. Thereby, until semiconductor storage device 100B receives an "end signal" from another semiconductor storage device 100B, semiconductor storage device 100B itself successively transfers the data received from the upstream side to semiconductor storage device 100B on the downstream side. When it receives the "end signal", semiconductor storage device 100B itself transmits the data stored in itself to downstream semiconductor storage device 100B. When the data transmission is completed, semiconductor storage device 100B itself subsequently transmits the "end signal" to downstream semiconductor storage device 100B.

In this manner, the data is successively transferred from semiconductor storage device 100B in the upstream end toward semiconductor storage device 100B on the downstream side so that it is possible to read the data stored in all semiconductor storage devices 100B of storage system 400.

More specifically, when each semiconductor storage device 100B starts the processing, it first transmits the start signal (step S200), and will wait for the reception of the start signal from upstream semiconductor storage device 100B for a predetermined period. This predetermined period may be determined randomly.

In this operation, at least semiconductor storage device 100B (Node N) located in the upstream end (i.e., remotest from reading unit 30B (FIG. 15)) continues the non-reception state in which it does not receive the start signal from another semiconductor storage device 100B, for a predetermined period (step S202). Thereby, Node N reads data N stored in its own mask ROM 70B shown in FIG. 15 (step S204), and transmits data N to neighboring semiconductor storage device 100B (Node N-1) (step S206). Thus, semiconductor storage device 100B starts the transmission of its own data only when it has not received the start signal from another semiconductor storage device 100B for a predetermined time. Identification data indicating that the data is provided from Node N may be added to data N to be transmitted. Further, when Node N completes the transmission of its own data, it then transmits the end signal to neighboring Node N-1.

When Node N-1 receives data N from Node N, it transmits (transfers) data N to neighboring Node N-2 (not shown) as it is (step S208). Data N is further transferred successively from Node N-2 to Node 1 in a similar manner. Node 1 that received data N (step S210) provides (transmits) received data N to reading unit 30B (FIG. 15) (step S212). By the above procedure, the data stored in Node N is read out.

When Node N-1 receives the end signal transmitted subsequently to data N, Node N-1 reads data N-1 stored in its own mask ROM 70B (step S214), and transmits data N-1 to neighboring Node N-2 (not shown) (step S216). Subsequently, data N-1 is successively transferred from Node N-2 to Node 1 similarly to data N. Node 1 that received data N-1 (step S218) provides (transmits) received data N-1 to reading unit 30B (step S220). Through the procedure described above, data N-1 stored in Node N-1 is read out. When Node N-2 completes the transmission of its own data, it subsequently transmits the end signal to neighboring Node N-2.

Each of Nodes N-2-1 transfers the data received from the upstream side to the downstream side in a similar manner, and thereafter will start the transmission of the data stored in itself when it receives the end signal that is transmitted from the upstream side subsequently to the data.

Finally, when Node 1 receives data 2 from Node 2 (step S222), Node 1 provides received data 2 to reading unit 30B (step S224). When Node 1 receives the end signal transmitted from Node 2 (S223), Node 1 reads data 1 stored in its own mask ROM 70B (step S226), and provides (transmits) it to reading unit 30B (step S228).

Through a series of processing described above, data can be read from all semiconductor storage devices 100B (Node 1 to Node N). A series of such data is temporarily accumulated in control circuit 60B (FIG. 15), and will be partially or entirely output as the read-out data from interface unit 12 when necessary.

According to the present embodiment, the data communications are performed in the autonomous fashion between each semiconductor storage device 100B and another neighboring semiconductor storage device 100B, and the data is successively transferred according to the predetermined communication rules. Therefore, semiconductor storage devices 100B forming storage system 400 can be arbitrarily selected, and all the data can be read out by providing only one reading unit independently of the number of semiconductor storage devices 100B. Further, the order of arrangement of semiconductor storage devices 100B can be set without any restriction.

Accordingly, even when the data to be saved increases, semiconductor storage devices 100B can be added or changed flexibly and freely.

According to the present embodiment, each semiconductor storage device 100B is provided with recess, and rack 410 is provided with the corresponding projection in an appropriate position so that semiconductor storage devices 100B can be accommodated to keep the predetermined positional relationship between neighboring semiconductor storage devices 100B. Therefore, the positional relationship required for establishing the ad-hoc network can be implemented without requiring user's awareness.

Modification of the Third Embodiment

The embodiments have been described in connection with the example of the semiconductor storage devices containing the solar cells that generate the internal electric power by receiving externally emitted light. However, the device may employ a structure that generates the internal electric power by receiving externally emitted electromagnetic energy.

Figure 19:
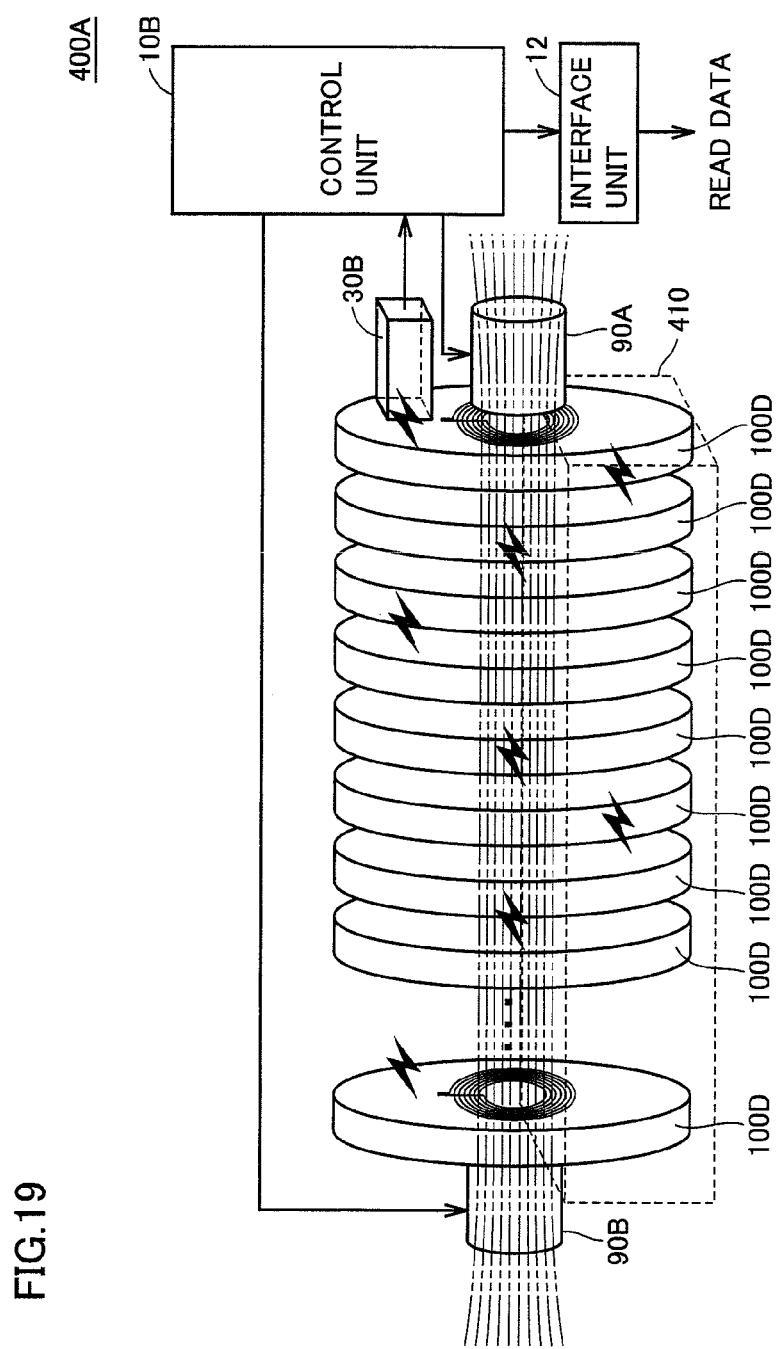
FIG. 19 shows an outer appearance of a storage system 400A according to a modification of the third embodiment of the invention.

FIG. 19 shows an outer appearance of a storage system 400A according to a modification of the third embodiment of the invention. Referring to FIG. 19, storage system 400A according to the modification of the present embodiment includes a plurality of semiconductor storage devices 100D, magnetic flux supply units 90A and 90B supplying magnetic flux to semiconductor storage devices 100D, reading unit 30B arranged close to semiconductor storage device 100D located in one end, control unit 10B and interface unit 12. Rack 410, magnetic flux supply units 90A and 90B, reading unit 30B, control unit 10B and interface unit 12 function as the "data reading device".

Semiconductor storage device 100D according to the modification of the present embodiment has substantially the same structure as semiconductor storage device 100B according to the third embodiment except for the manner of externally supplying the energy in the non-contact fashion. Specifically, when magnetic flux supply units 90A and 90B of each semiconductor storage device 100D start the supply of the magnetic flux, one of semiconductor storage devices 100D transmits by radio the data received from any neighboring semiconductor storage device 100D to any other neighboring semiconductor storage device 100D, and also transmits by radio the data stored in itself to that other neighboring semiconductor storage device 100D.

Magnetic flux supply units 90A and 90B are arranged on the opposite sides of the series of semiconductor storage devices 100D, respectively, and are opposed to each other for generating the magnetic flux (alternating magnetic flux) penetrating semiconductor storage devices 100D. The magnetic flux thus generated causes linkage with a coil (to be described later) of each semiconductor storage device 100D so that it is converted into the internal electric power.

Control unit 10B, interface unit 12 and reading unit 30B are substantially the same as those in storage system 400 shown in FIG. 14, and therefore, description thereof is not repeated.

Figure 20:
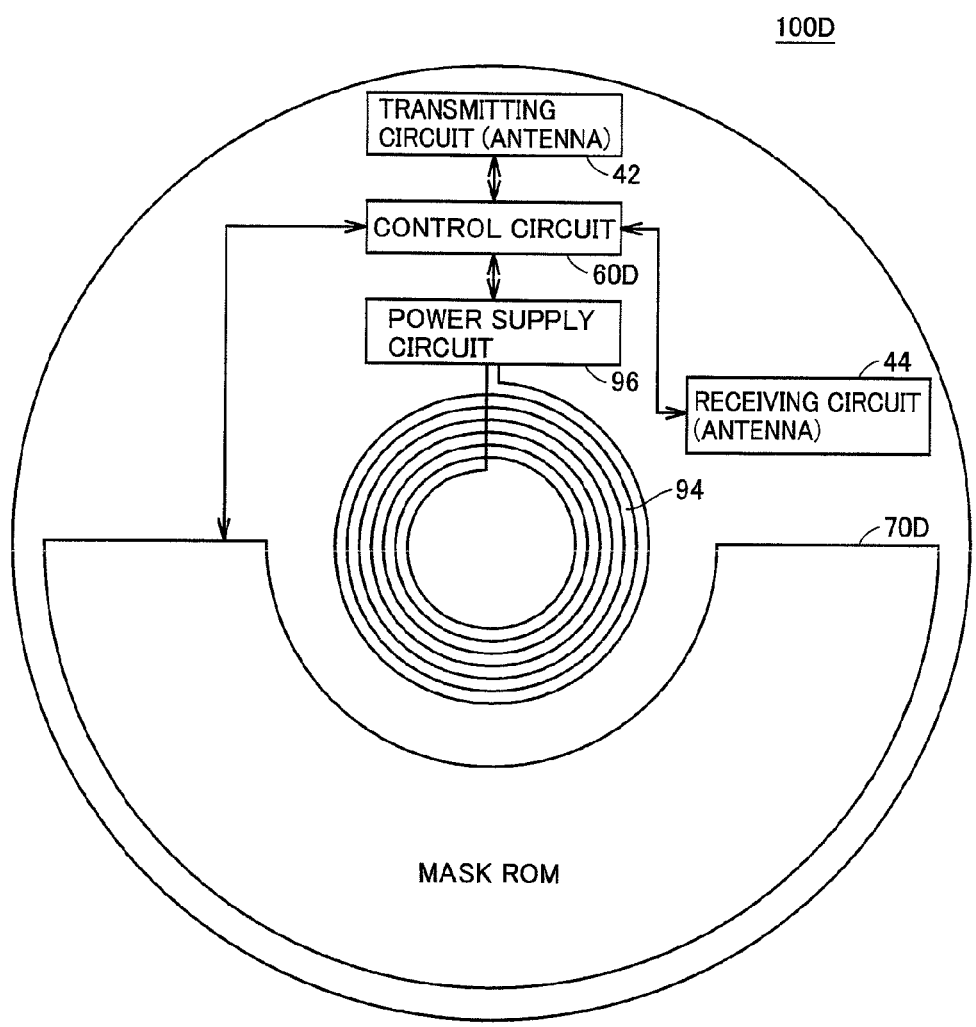
FIG. 20 is a block diagram showing a planar structure of a semiconductor storage device 100D according to a modification of the third embodiment of the invention.

FIG. 20 is a block diagram showing a planar structure of semiconductor storage device 100D according to the modification of the third embodiment of the invention.

Referring to FIG. 20, each semiconductor storage device 100D includes a coil 94, a power supply circuit 96, a control circuit 60D, a mask ROM 70D, transmitting circuit 42 including transmitting antenna and receiving circuit 44 including receiving antenna. Transmitting circuit 42 and receiving circuit 44 function as a "communication unit". These portions are formed on a physicochemically stable substrate (wafer), and the exposed surfaces thereof are entirely covered with a sealing film (typically, made of physicochemically stable insulation substance such as silicon dioxide).

Coil 94 is formed at a center of the wafer, and induces an electromotive force by receiving the alternating magnetic flux from magnetic flux supply units 90A and 90B (FIG. 19). The electromotive force induced by coil 94 is provided to power supply circuit 96. Power supply circuit 96 has a rectifying function and a smoothing effect, and produces internal DC power from the AC electromotive power generated by coil 94. More specifically, power supply circuit 96 includes a full-wave rectification circuit formed of a bridge circuit of diodes and the like, and also includes a smoothing circuit formed of a capacitor connected in parallel to the line.

When power supply circuit 96 starts the power supply, control circuit 60D cooperates with transmitting and receiving circuits 42 and 44 to form the ad-hoc network with respect to another semiconductor storage device 100D. Specifically, control circuit 60D functions as a relay device for transferring the data from one neighboring semiconductor storage device 100D to other neighboring semiconductor storage device 100D. In addition to this relay operation, control circuit 60D transmits its own stored data to the transfer destination, i.e., above other semiconductor storage device 100D by reading the data from mask ROM 70D and providing it to transmitting circuit 42. The communication processing over the ad-hoc network is substantially the same as those in the third embodiment, and therefore description thereof is not repeated.

Mask ROM 70D has substantially the same structure as mask ROM 70 already described, and therefore description thereof is not repeated.

Transmitting and receiving circuits 42 and 44 are substantially the same as those in the foregoing third embodiment except for that transmitting and receiving circuits 42 and 44 in this modification operate by receiving the electric power from power supply circuit 96.

The modification of the present embodiment can offer substantially the same effect as the third embodiment already described. Further, the modification can increase the generation efficiency of the internal electric power per unit area by increasing the intensity of the supplied magnetic flux and/or the number of coil windings, and therefore can increase the region where the mask ROM is formed in each semiconductor storage device. Consequently, the storage capacity of each semiconductor storage device can be increased.

Fourth Embodiment

Storage system 400 according to the above third embodiment has been described in connection with the example of the structure that includes semiconductor storage devices 100B arranged in a one-dimensional fashion and transfers unidirectionally the data stored in each semiconductor storage device 100B. In contrast to this, a fourth embodiment will be described in connection with an example in which the semiconductor storage devices are arranged in a two- or three-dimensional fashion.

Figure 21:
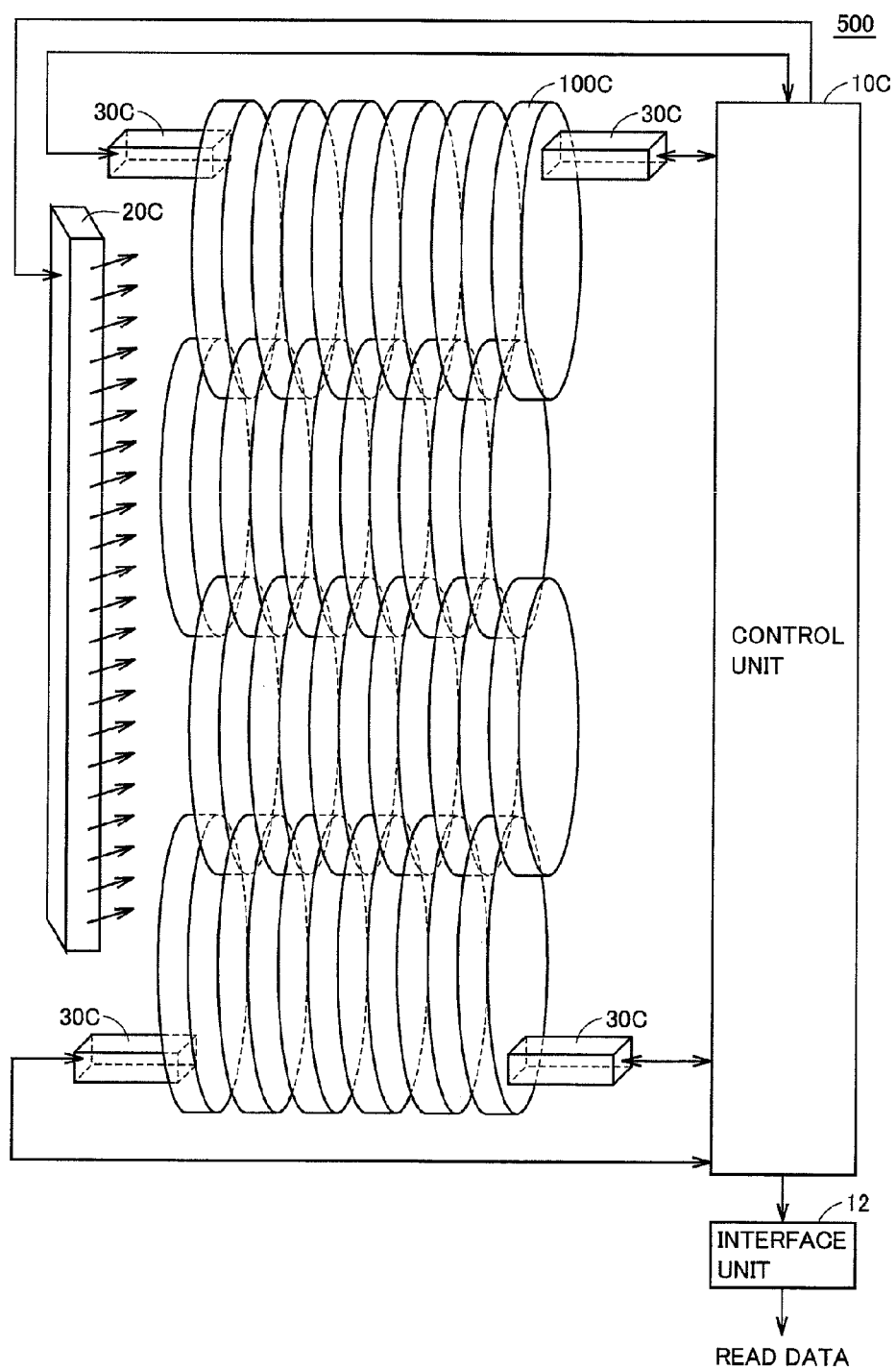
FIG. 21 shows an outer appearance of a storage system 500 according to a fourth embodiment of the invention.

FIG. 21 shows an outer appearance of a storage system 500 according to the fourth embodiment of the invention.

Referring to FIG. 21, storage system 500 according to the present embodiment includes a plurality of semiconductor storage devices 100C, a light emitting unit 20C for emitting the light to semiconductor storage devices 100C, four reading units 30C arranged close to semiconductor storage devices 100C located on the four corners, respectively, a control unit 10C and interface unit 12. Light emitting unit 20C, reading unit 30C, control unit 10C and interface unit 12 function as the "data reading device".

In storage system 500 according to the present embodiment, semiconductor storage devices 100C similar to semiconductor storage device 100B according to the third embodiment already described are arranged in the two-dimensional fashion. Except for semiconductor storage devices 100C arranged on the four corners, respectively, each semiconductor storage device 100C is adjacent to two to four semiconductor storage devices 100C. Each semiconductor storage device 100C includes a plurality of transmitting/receiving circuits that can perform the transmission and reception to/from another semiconductor storage device 100C, and the independent transmission and reception of the data can be performed between neighboring semiconductor storage devices 100C.

In addition to the functions of reading unit 30B according to the third embodiment, each reading unit 30C has a function of transferring a command provided from control unit 10C to neighboring semiconductor storage device 100C.

Light emitting unit 20C is substantially the same as light emitting unit 20B according to the third embodiment, and therefore description thereof is not repeated.

The employment of the network structure shown in FIG. 21 can increase the degree of flexibility of the path from semiconductor storage device 100C to be read to control unit 10C. Thus, it is possible to provide a plurality of paths from semiconductor storage device 100C of the read target to control unit 10C. Therefore, even when a failure occurs in one of semiconductor storage devices 100C, the data reading can be continued. Alternatively, the read speed can be increased by reading the data in parallel through a plurality of paths.

In storage system 500 according to the present embodiment, since each semiconductor storage device 100C can perform the transmission and reception of data independently of other semiconductor storage devices 100C, storage system 500 can selectively read out the required data, e.g., in response to an external request.

Figure 22:
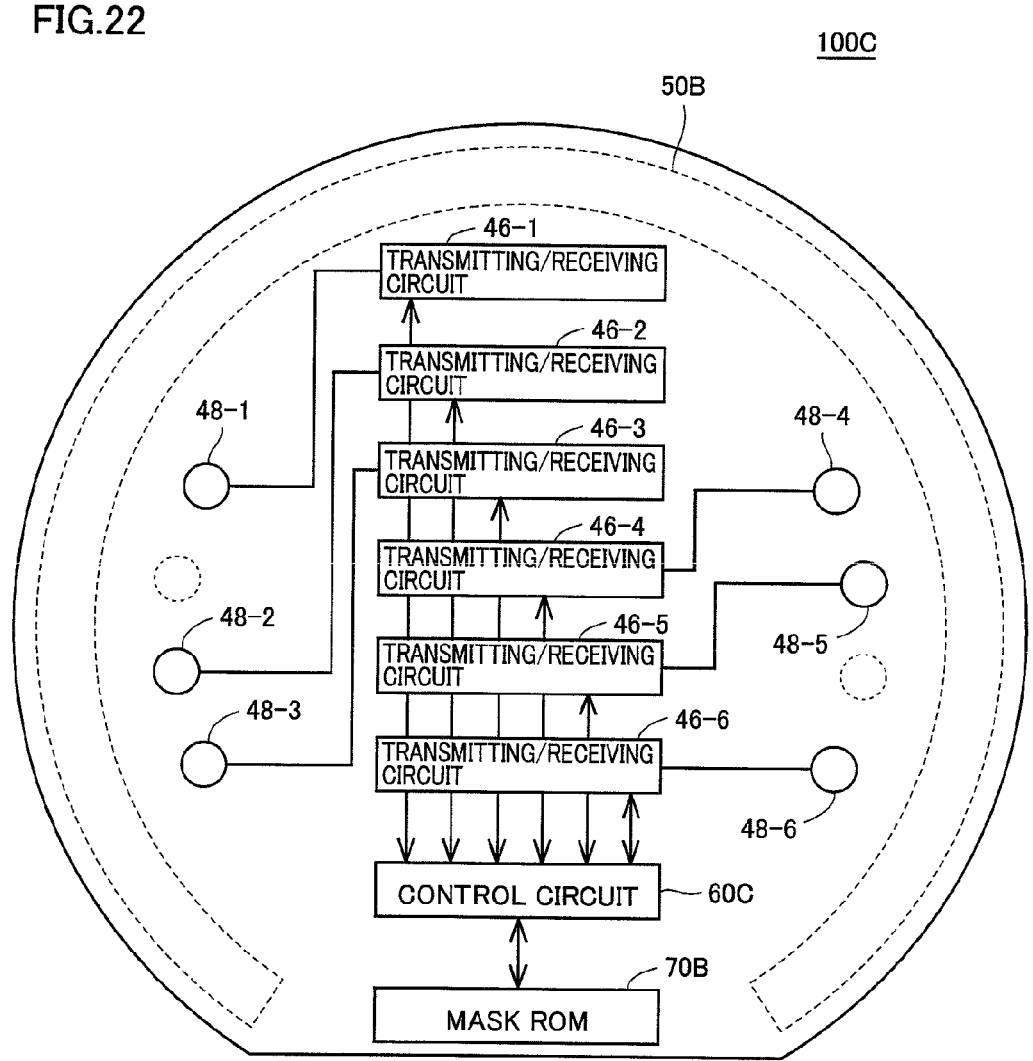
FIG. 22 is a block diagram showing a planar structure of a semiconductor storage device 100C according to the fourth embodiment of the invention.

FIG. 22 is a block diagram showing a planar structure of semiconductor storage device 100C according to the fourth embodiment of the invention.

Referring to FIG. 22, each of semiconductor storage devices 100C includes solar cell 50B, a control circuit 60C, mask ROM 70B, six transmitting/receiving circuits 46-1 to 46-6, and antennas 48-1 to 48-6 corresponding to respective transmitting/receiving circuits 46-1 to 46-6. These portions are formed on a wafer, and the exposed surfaces thereof are entirely covered with a sealing film (typically, made of physicochemically stable insulation substance such as silicon dioxide).

When solar cell 50B starts the power supply, control circuit 60C cooperates with transmitting/receiving circuits 46-1 to 46-6 to form an ad-hoc network with respect to at least one neighboring semiconductor storage device 100C. Specifically, control circuit 60C determines whether the stored data of semiconductor storage device 100C to which control circuit 60C belongs is a target of a data request command or not, when one of transmitting/receiving circuits 46-1 to 46-6 receives this data request command from neighboring semiconductor storage device 100C. When it is the target, control circuit 60C reads the requested data from mask ROM 70B and transmits it to neighboring semiconductor storage device 100C. When it is not the target, control circuit 60C transfers the received data request command to another neighboring semiconductor storage device 100C. Specific communication processing will be described later.

Transmitting/receiving circuits 46-1 to 46-6 receive the electric power from solar cell 50B, and excite corresponding antennas 48-1 to 48-6 according to the command provided from control circuit 60C, respectively. Thereby, transmitting/receiving circuits 46-1 to 46-6 transmit radio signal (modulation signal) to neighboring semiconductor storage devices 100C. Also, transmitting/receiving circuits 46-1 to 46-6 decode the radio signal received through corresponding antennas 48-1 to 48-6 from another semiconductor memory device 100C for outputting the obtained data to control circuit 60C.

Solar cell 50B and mask ROM 70B are substantially the same as those in semiconductor storage device 100B according to the third embodiment, and therefore description thereof is not repeated.

The sectional structures of semiconductor storage device 100C according to the present embodiment are substantially the same as those of semiconductor storage device 100B according to the third embodiment, and therefore description thereof is not repeated.

Since each semiconductor storage device 100C according to the present embodiment performs the processing of transmitting and receiving the radio signal independently of the other semiconductor storage devices, antennas 48-1 to 48-6 formed on the wafer surface are spaced from each other by a predetermined distance for preventing the interference between the radio signals. More specifically, antennas 48-1 to 48-6 are arranged on the same circle spaced by a predetermined distance from the center of the wafer, and are spaced from each other by a predetermined circumferential angle.

Figure 23:
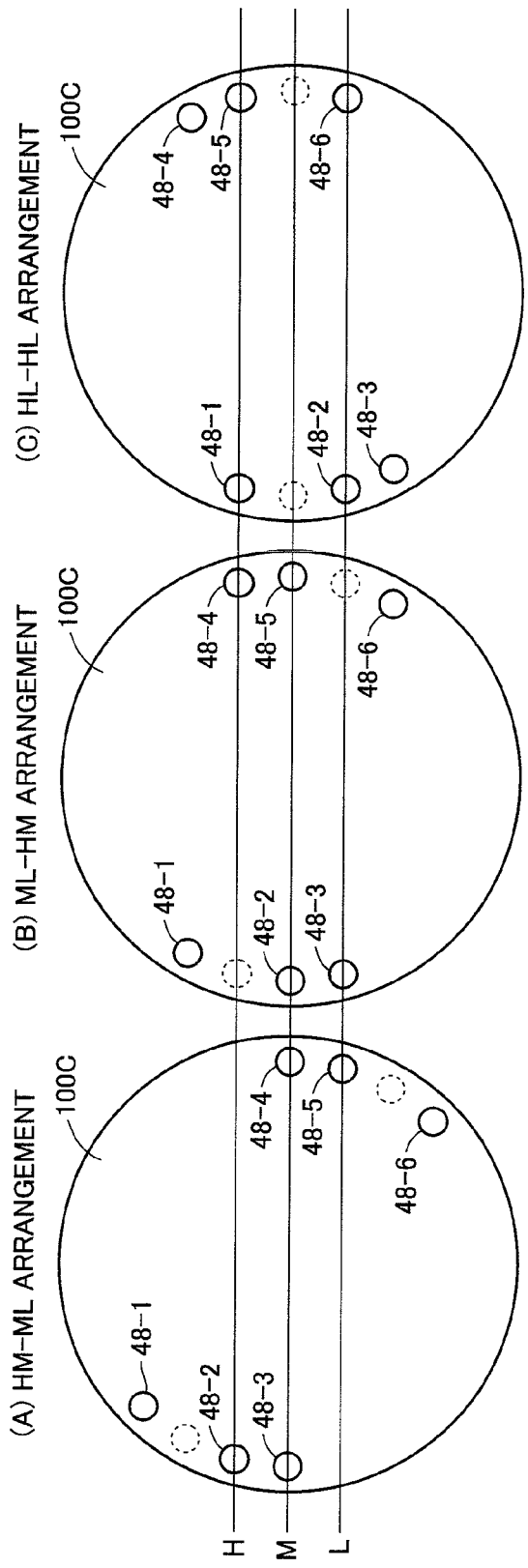
FIG. 23 schematically shows an antenna arrangement in semiconductor storage device 100C according to the third embodiment of the invention.

FIG. 23 schematically shows an antenna arrangement in semiconductor storage device 100C according to the third embodiment of the invention.

Referring to FIG. 23, in each semiconductor storage device 100C, antennas 48-1 to 48-3 are arranged on a left part of the circle, i.e., a part on the left side of the sheet of the figure, and antennas 48-4 to 48-6 are arranged on a right part of the circle. Antennas 48-1 to 48-3 are symmetrical with respect to antennas 48-4 to 48-6 about the center of the wafer.

The circumferential angle between antennas 48-1 and 48-2 is about twice as large as that between antennas 48-2 and 48-3. Likewise, the circumferential angle between antennas 48-6 and 48-5 is about twice as large as that between antennas 48-5 and 48-4. This arrangement of antennas 48-1 to 48-6 can avoid crosstalk between neighboring semiconductor storage devices 100C arranged in a three-dimensional fashion as described below.

More specifically, it is assumed that three imaginary lines H, M and L are present between neighboring semiconductor storage devices 100C. By changing the relative angle of each semiconductor device 100C, the arrangement of antennas 48-1-48-6 crossing these straight lines H, M and L can be selected from among at least three arrangement patterns.

FIG. 23(A) shows an "HM-ML arrangement" in which antennas 48-2 and 48-3 of semiconductor device 100C arranged on the left side of the sheet of the figure intersect lines H and M, respectively, and antennas 48-4 and 48-5 of semiconductor device 100C arranged on the right side of the sheet intersect lines M and L, respectively.

FIG. 23(B) shows an "ML-HM arrangement" in which antennas 48-2 and 48-3 of semiconductor device 100C arranged on the left side of the sheet of the figure intersect lines M and L, respectively, and antennas 48-4 and 48-5 of semiconductor device 100C arranged on the right side of the sheet intersect lines H and M, respectively.

FIG. 23(C) shows an "HL-HL arrangement" in which antennas 48-1 and 48-2 of semiconductor device 100C arranged on the left side of the sheet of the figure intersect lines H and L, respectively, and antennas 48-5 and 48-6 of semiconductor device 100C arranged on the right side of the sheet intersect lines H and L, respectively.

Figure 24:
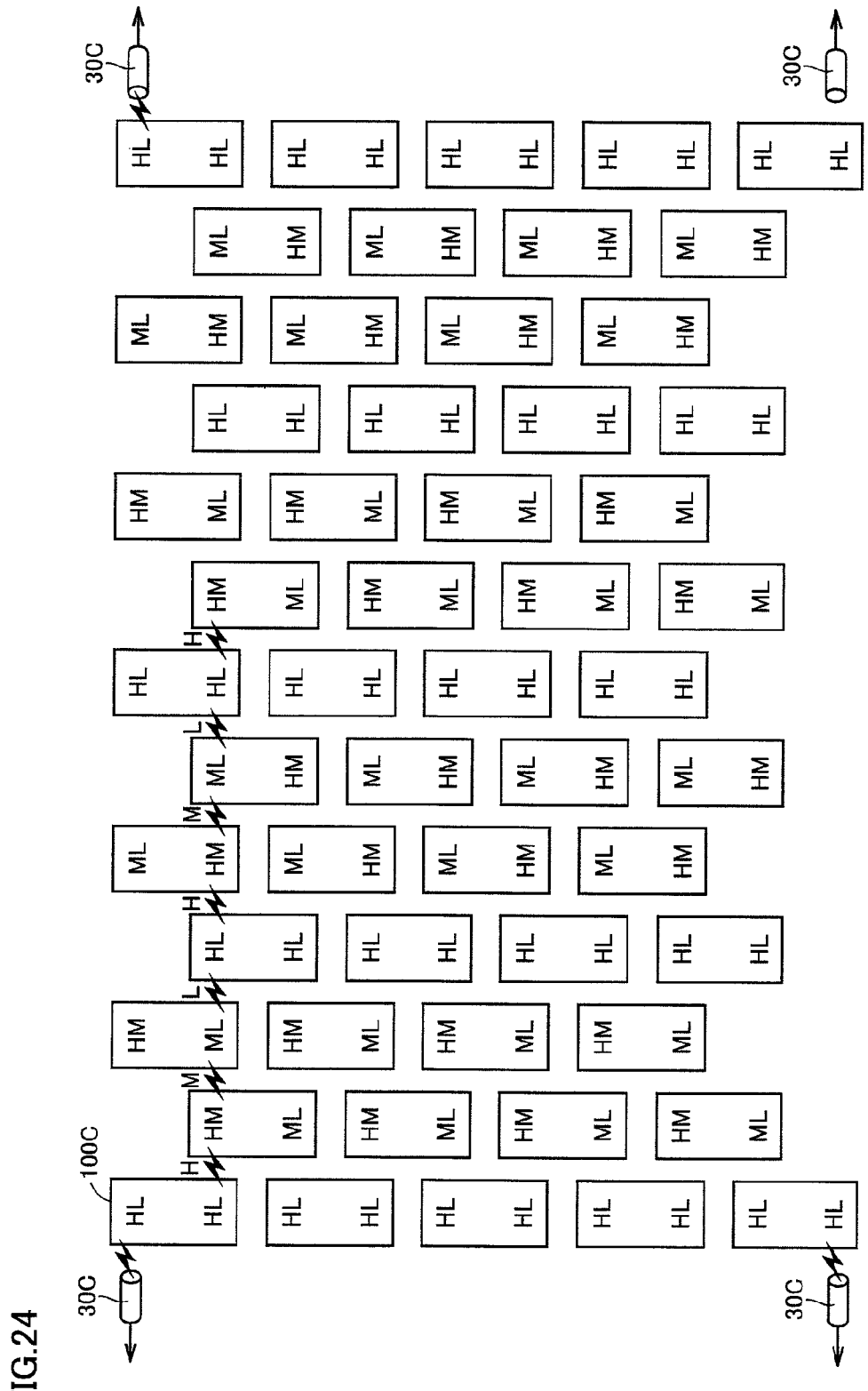
FIG. 24 schematically shows a positional relationship in semiconductor device 100C in the case where a storage system 500 shown in FIG. 21 is formed.

FIG. 24 schematically shows a positional relationship in semiconductor device 100C in the case where storage system 500 shown in FIG. 21 is formed. In FIG. 24, characters "HL", "HM" and "HL" correspond to the respective patterns shown in FIG. 23.

In FIG. 24, semiconductor storage devices 100C neighboring to each other can perform the data transmission and reception through the antennas arranged on the same straight line. For example, semiconductor storage device 100C indicated by characters "HL" has the antennas located to intersect lines H and L shown in FIG. 23, and semiconductor storage device 100C indicated by characters "HM" has the antennas located to intersect lines H and M shown in FIG. 23. Therefore, the antennas of respective semiconductor devices 100C are present in the positions of "H" with respect to the vertical direction of the sheet of FIG. 24, i.e., on the same straight line H extending in the lateral direction of the sheet. Therefore, neighboring semiconductor storage devices 100C perform the data transmission and reception through the two antennas located on straight line H.

Owing to the arrangement in FIG. 24, the positions of the antennas used for the data communications between neighboring semiconductor storage devices 100C on the front surface side of semiconductor storage device 100C, i.e., on the right side of the sheet of FIG. 24 can be different from those on the rear surface side of semiconductor storage device 100C, i.e., on the left side of the sheet of FIG. 24. More specifically, as shown in FIG. 24, the positions of the antennas used for the data transmission and reception between semiconductor storage devices 100C arranged on the uppermost side of the sheet of FIG. 24 and semiconductor memory devices 100C neighboring to them change cyclically in the order of "H", "M", "L", "H", . . . .

A network topology of storage system 500 shown in FIG. 21 is two-dimensional. In storage system 500 according to the present embodiment, therefore, each semiconductor storage device 100C performs the control according to a path setting protocol to form dynamically a logical communication path. The path setting protocol relating to the data transmission will now be described with reference to FIGS. 25 and 26.

Figure 25:
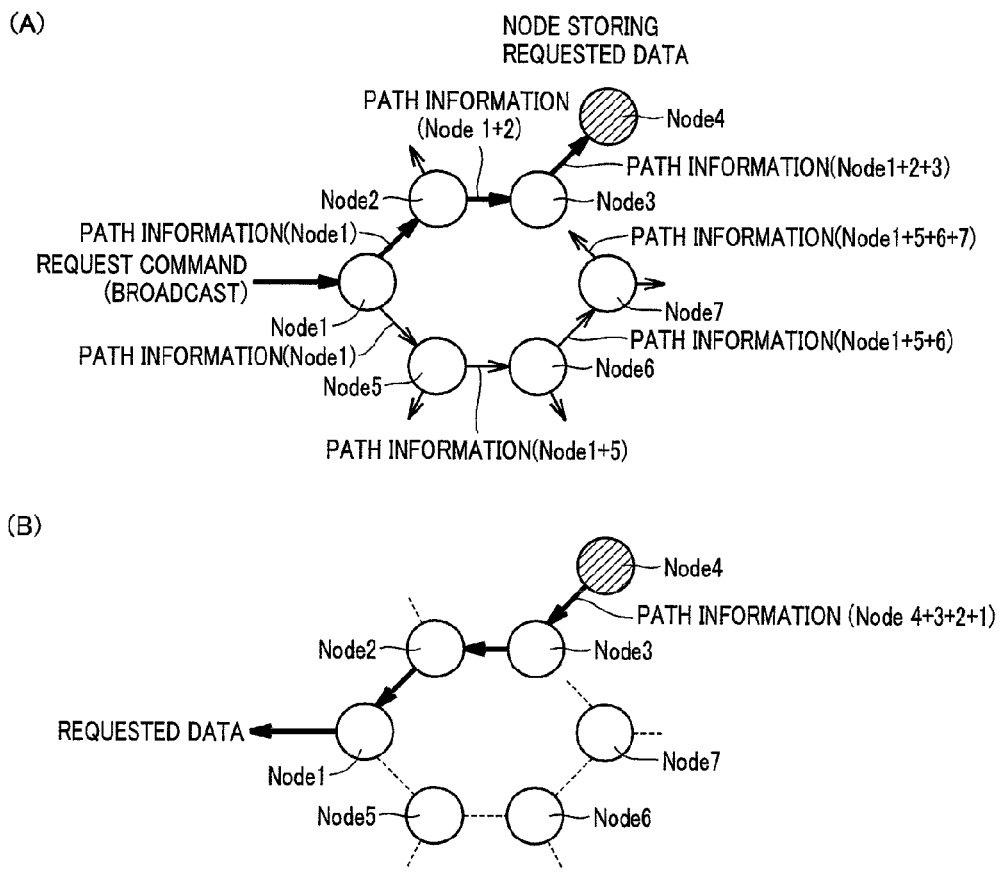
FIG. 25 illustrates a path setting protocol in storage system 500 according to the fourth embodiment of the invention.

FIG. 25 illustrates the path setting protocol in storage system 500 according to the fourth embodiment of the invention. FIG. 26 illustrates processing in the case where a network shown in FIG. 25 has a failure. In FIGS. 25 and 26, semiconductor storage devices 100C may also be referred to as "Node 1 to Node 7" for the sake of convenience, and it is assumed that reading unit 30C neighbors to semiconductor storage device 100C corresponding to Node 1. The topology shown in FIGS. 25 and 26 is an example of the logical connection relationship between the Nodes, and may be different from the actual positional relationship of semiconductor storage devices 100C.

Referring to FIG. 25, when interface unit 12 (FIG. 21) provides a read request for specific data to control unit 10C, a request command is transmitted to Node 1. For example, it is assumed that this request command includes a message requesting the reading of the data stored in Node 4. This request command is handled as a broadcast message.

Each Node determines based on the details of the request command whether the data stored in itself includes the requested data or not. When the Node determines that the data stored in itself does not include the requested data, the Node transfers the request command of interest to the another neighboring Node different from the sender of the request command. When there are several neighboring Nodes, the request command may be transferred to one or mode Nodes. FIG. 25(A) shows the case where Node 1 transfers the received request command to Node 2 and Node 5.

In the above operation, each Node adds, as path information, its own information (i.e., information about the Node of interest) to the request command to be transferred to the neighboring Node. Thus, as shown in FIG. 25(A), "Node 1" is added as the path information to the request commands that are transferred from Node 1 to Node 2 and Node 5, respectively.

Based on the details of the request command, each of Node 2 and Node 5 receiving the request command from Node 1 determines whether the data stored in itself includes the requested data or not. Each Node determines that the data stored in itself does not include the requested data. Therefore, each of Node 2 and Node 5 adds, as the path information, the information about itself to the received request command, and transfers the request command to the neighboring Node.

Thus, as shown in FIG. 25(A), "Node 1+2" is added as the path information to the request command transferred from Node 2 to Node 3, and "Node 1+2" is added as the path information to the request command transferred from Node 5 to Node 6.

Similar processing is performed subsequently, and the transmission request is finally transferred through the two paths to Node 3. Node 3 receiving the same transmission requests refers to the path information added thereto, and transfers the transmission request relayed via a smaller number of Nodes to neighboring Node 4. Alternatively, processing may be configured to transfer only the transmission request that reached the Node earlier than the other.

Node 4 determines that the data stored in itself includes the requested data. Node 4 reads out the requested data stored in its own mask ROM 70B, and returns the read data to the Node of the sender of the request command. In this operation, as shown in FIG. 25(B), the data transmitted from Node 4 bears the path information added thereto. This path information is produced based on the path information added to the received transmission request and, in the example shown in FIG. 25(B), "Node 4+3+2+1" is added as the path information. Thereafter, according to the added path information, the requested data is transferred through the Nodes, and is finally output or transmitted from Node 1 to reading unit 30C (FIG. 21).

Alternatively, the data can be read out in parallel through the two paths between Node 1 and Node 4. This can increase the read speed.

In the above topology, a certain failure may occur in the path between Node 2 and Node 3 to disable the transmission and reception of the data. In this case, processing is performed as described below.

As shown in FIG. 26(A), when the request command is provided to Node 1, this request command is transferred to Node 2 similarly to FIG. 25(A) already described. However, Node 2 cannot transfer the request command to Node 3.

However, the request command transferred from Node 1 to Node 5 is transferred through Node 5, Node 6 and Node 7 to Node 3. Further, this request command is transferred from Node 3 to Node 4.

When Node 4 receives the request command transferred from Node 3, Node 4 reads out the requested data stored its own mask ROM 70B, and sends the read data to the Node of the sender of the request command. In this operation, the data read out from Node 4 is transferred in the order of Node 4, Node 3, Node 7, Node 6 and Node 5 based on the path information "Node 1+5+7+3" added to the request command, and reaches Node 1.

In the structure having a plurality of paths from Node 1 to Node 4, as described above even when a certain path cannot be used due to a certain failure, the data can be read out through another path.

According to the present embodiment, since each semiconductor storage device 100C autonomously establishes the ad-hoc network to neighboring another semiconductor storage device 100C, semiconductor storage devices 100C forming storage system 500 can be freely designed. Further, the order of arrangement of semiconductor storage devices 100C can be freely designed.

Accordingly, even when the data to be held increases, addition or change of semiconductor storage devices 100C can be flexibly and freely performed.

According to the present embodiment, even when a failure occurs in certain semiconductor storage device 100C, another path is automatically selected to continue the reading of the requested data. Therefore, the highly reliable storage system can be implemented by increasing redundancy.

Modification of the Fourth Embodiment

Similarly to the modification of the third embodiment, the fourth embodiment described above may be configured to generate the internal electric power in each semiconductor storage device by externally supplying the electromagnetic energy (alternating magnetic flux). A specific structure for it is substantially the same as that of the modification of the third embodiment, and therefore description thereof is not repeated.

Other Embodiments

In the first to fourth embodiments and the modifications thereof that have been exemplified, the structure using the light energy (solar cell) or the structure using the electromagnetic energy is used as the structure for supplying the energy to the semiconductor storage device in the non-contact fashion. However, another structure may be used.

For example, a structure of externally supplying thermal energy may be employed. Specifically, a thermoelectric converter element having the Seebeck effect may be formed on each semiconductor storage device. In this structure, thermal energy is externally supplied to each semiconductor storage device. Thus, a thermal change is caused in each semiconductor device. Thereby, the internal electric power can be generated.

Although the present invention has been described and illustrated in detail, it is clearly understood that the same is by way of illustration and example only and is not to be taken by way of limitation, the scope of the present invention being interpreted by the terms of the appended claims.

The invention claimed is:
1. A storage system comprising:
a plurality of semiconductor storage devices; and
a data reading device, wherein
said plurality of semiconductor storage devices are arranged close to each other according to a predetermined rule;
each of said plurality of semiconductor storage devices includes:
a light-transmitting substrate;
an electric power generating unit for receiving the light passed through said substrate and generating electric power,
a nonvolatile storage unit arranged on said substrate for nonvolatilely storing the data,
a communication unit arranged on said substrate for receiving the electric power from said electric power generating unit and transmitting by radio the data stored in said nonvolatile storage unit to the semiconductor storage device neighboring to the device to which the communication unit belongs, and
a sealing film covering exposed surfaces of said electric power generating unit, said nonvolatile storage unit and said communication unit; and
said data reading device includes:
a light emitting unit for emitting light to said plurality of semiconductor storage devices, and
a reading unit arranged close to at least one of the plurality of closely arranged semiconductor storage devices for receiving the data transmitted by radio from the semiconductor storage device.

2. The storage system according to claim 1, wherein
said communication unit transfers the data received from any neighboring semiconductor storage device to any other neighboring semiconductor memory device.

3. The storage system according to claim 2, wherein
said communication unit transfers the data received from the neighboring semiconductor storage device to a destination and thereafter transmits the data stored in said nonvolatile storage device to the destination.

4. The storage system according to claim 2, wherein
said substrate has a substantially circular disk-like form;
said communication unit includes:
a receiving unit for receiving the data from a semiconductor storage device neighboring to the device to which the communication unit belongs, and
a transmitting unit for transmitting the data to another neighboring semiconductor storage device neighboring to the device to which the communication unit belongs;
said receiving unit and said transmitting unit are spaced from each other by a predetermined circumferential angle about a center of said substantially circular disk-like substrate; and
said plurality of semiconductor storage devices are arranged to have diametrical centers aligned on the same straight line, and the receiving unit of one of the neighboring two semiconductor storage devices is close to the transmitting unit of the other of the neighboring two semiconductor storage devices.

5. The storage system according to claim 1, wherein
each of said plurality of semiconductor storage devices is arranged close to the plurality of other semiconductor storage devices,
said communication unit includes a plurality of transmitting/receiving units configured to perform data transmission and data reception with respect to the semiconductor storage device neighboring to the device to which the communication unit belongs, and
each of said transmitting/receiving units establishes an ad-hoc network with respect to the neighboring semiconductor storage device.

6. The storage system according to claim 1, wherein
said sealing film is a silicon dioxide film.

7. A storage system comprising:
a plurality of semiconductor storage devices; and
a data reading device, wherein
said plurality of semiconductor storage devices are arranged close to each other according to a predetermined rule,
each of said plurality of semiconductor storage devices includes:
a substrate,
a nonvolatile storage unit arranged on said substrate for nonvolatilely storing the data,
an electric power generating unit arranged on said substrate for receiving energy externally supplied in a non-contact fashion and generating internal electric power,
a communication unit, arranged on said substrate, configured to receive said internal electric power and perform transmission and reception of the data by radio signals with respect to the semiconductor storage device neighboring to the device to which the communication unit belongs, and
a sealing film covering exposed surfaces of said electric power generating unit, said nonvolatile storage unit and said communication unit;
when said communication unit receives the data from any neighboring semiconductor storage device, said communication unit transfers said received data to any other semiconductor memory device; and
said data reading device includes a reading unit neighboring to at least one of the plurality of closely arranged semiconductor storage devices for receiving the data transferred from said neighboring semiconductor storage device.

8. The storage system according to claim 7, wherein
said communication unit transfers the data received from the neighboring semiconductor storage device to a destination and thereafter transmits the data stored in said nonvolatile storage device to the destination.

9. The storage system according to claim 7, wherein
each of said plurality of semiconductor storage devices is arranged close to other semiconductor storage devices,
said communication unit includes a plurality of transmitting/receiving units configured to perform data transmission and data reception with respect to the semiconductor storage device neighboring to the device to which the communication unit belongs, and
each of said transmitting/receiving units establishes an ad-hoc network with respect to the neighboring semiconductor storage device.

10. The storage system according to claim 7, wherein
said substrate is a light-transmitting substrate,
said electric power generating unit is a solar cell for receiving light passed through said substrate and generating an electric power, and
said data reading device further includes a light emitting unit for emitting the light to said plurality of semiconductor storage devices.

11. The storage system according to claim 7, wherein
said data reading device further includes a magnetic flux supply unit for supplying an alternating magnetic flux to said plurality of semiconductor storage devices, and
said electric power generating unit includes:
a coil disposed in a position causing linkage with said alternating magnetic flux, and
a power supply circuit for producing the internal electric power from electromotive force generated by linkage between said coil and the alternating magnetic flux.

12. A storage system comprising:
a semiconductor storage device; and
data reading device, wherein
said semiconductor storage device includes:
a substrate,
a plurality of storage cells arranged on said substrate, and
a sealing film covering exposed surfaces of said plurality of storage cells;
each of said plurality of storage cells includes:
a nonvolatile storage unit for nonvolatilely storing data,
an electric power generating unit for receiving energy externally supplied in a non-contact fashion and generating internal electric power, and
a transmitting unit for receiving said internal electric power and transmitting by radio the data stored in said nonvolatile storage unit; and
said data reading device includes:
an energy supply unit for supplying energy to said semiconductor storage device,
a plurality of receiving units arranged in said plurality of storage cells of said semiconductor storage device, respectively, and
a circuit for outputting, as a series of data row, the data received by said plurality of receiving units.

13. A storage system comprising:
a semiconductor storage device; and
data reading device, wherein
said semiconductor storage device includes:
a substrate,
a plurality of storage cells arranged on said substrate, and
a sealing film covering exposed surfaces of said plurality of storage cells;
each of said plurality of storage cells includes:
a nonvolatile storage unit for nonvolatilely storing data,
an electric power generating unit for receiving energy externally supplied in a non-contact fashion and generating internal electric power, and
a transmitting unit for receiving said internal electric power and transmitting by radio the data stored in said nonvolatile storage unit; and
said data reading device includes:
an energy supply unit for supplying energy to said semiconductor storage device,
a plurality of receiving units arranged in said plurality of storage cells of said semiconductor storage device, respectively,
a buffer for temporarily storing the data received by said plurality of receiving units, and
a circuit for selectively extracting the data stored in said buffer.

* * * * *